(12) United States Patent
Zhou et al.

(10) Patent No.: US 11,963,400 B2
(45) Date of Patent: Apr. 16, 2024

(54) DISPLAY PANEL AND DISPLAY DEVICE

(71) Applicant: Wuhan Tianma Microelectronics Co., Ltd., Wuhan (CN)

(72) Inventors: Hongbo Zhou, Wuhan (CN); Huangyao Wu, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 0 days.

(21) Appl. No.: 18/135,373

(22) Filed: Apr. 17, 2023

(65) Prior Publication Data

US 2023/0255061 A1     Aug. 10, 2023

Related U.S. Application Data

(63) Continuation of application No. 17/829,652, filed on Jun. 1, 2022, now Pat. No. 11,683,957.

(30) Foreign Application Priority Data

Jun. 30, 2021 (CN) .......................... 202110736811.8

(51) Int. Cl.
    *G09G 3/3233*     (2016.01)
    *H10K 59/121*     (2023.01)
    *H10K 59/131*     (2023.01)

(52) U.S. Cl.
CPC ....... *H10K 59/1213* (2023.02); *G09G 3/3233* (2013.01); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01)

(58) Field of Classification Search
CPC ............ H10K 59/1213; H10K 59/131; G09G 3/3233; G09G 2300/0426; G09G 2300/0819; G09G 2300/0861; G09G 2310/08
See application file for complete search history.

(56) References Cited

U.S. PATENT DOCUMENTS

2019/0206969 A1*   7/2019   Hwang ................ G09G 3/3225

FOREIGN PATENT DOCUMENTS

| CN | 111697040 A | 9/2020 |
|---|---|---|
| CN | 111951729 A | 11/2020 |
| CN | 113013218 A | 6/2021 |
| CN | 113078174 A | 7/2021 |

* cited by examiner

*Primary Examiner* — Kevin M Nguyen
(74) *Attorney, Agent, or Firm* — KDW Firm PLLC

(57) ABSTRACT

A display panel and a display device are provided, and the display panel includes an array substrate. The array substrate includes a plurality of pixel circuits, a plurality of reference signal lines and a plurality of pixel connecting semiconductor portions. The plurality of pixel circuits is arranged in an array in a row direction and a column direction, each pixel circuit includes a pixel driving semiconductor portion which includes two fixed potential nodes, and the row direction intersects the column direction. The fixed potential nodes are electrically connected to at least one of the plurality of reference signal lines. Two fixed potential nodes adjacent in a first direction are electrically connected by one of the plurality of the pixel connecting semiconductor portions, and the first direction is parallel to a plane where the array substrate is located.

20 Claims, 22 Drawing Sheets

DISPLAY PANEL AND DISPLAY DEVICE

CROSS-REFERENCE TO RELATED APPLICATION

This is a continuation of U.S. patent application Ser. No. 17/829,652, filed Jun. 1, 2022, which claims priority to Chinese Patent Application No. CN202110736811.8 filed Jun. 30, 2021 at the CNIPA, the disclosures of which are incorporated herein by reference in their entireties.

FIELD

Embodiments of the present disclosure relate to the field of display technologies and, in particular, relate to a display panel and a display device.

BACKGROUND

Organic light-emitting diodes (OLED) are one of the hot topics in the field of display research. Compared with liquid crystal displays (LCDs), OLED display screens have the advantages of low energy consumption, low production cost, self-luminance, wide viewing angle and fast response speed. At present, OLED array substrates in display fields such as mobile phones, personal digital assistants (PDAs) and digital cameras have begun to replace conventional LCD array substrates.

Pixel circuits are provided in the OLED array substrate to drive the OLED light-emitting elements, and the pixel circuits still need to be improved.

SUMMARY

A display panel and a display device are provided according to embodiments of the present disclosure. The display panel includes a pixel circuit, and the pixel circuit is improved so that the performance of the pixel circuit is improved, and thereby, the display performance is improved.

In a first aspect, a display panel is provided according to an embodiment of the present disclosure. The display panel includes an array substrate, and the array substrate includes multiple pixel circuits, a reference signal line and a pixel connecting semiconductor portion.

The multiple pixel circuits are arranged in an array in a row direction and a column direction, each of the multiple pixel circuits includes a pixel driving semiconductor portion, the pixel driving semiconductor portion includes two fixed potential nodes, and the row direction intersects the column direction.

The fixed potential nodes are electrically connected to the reference signal line.

Two fixed potential nodes adjacent in a first direction are electrically connected by the pixel connecting semiconductor portion, and the first direction is parallel to a plane where the array substrate is located.

In a second aspect, a display device is further provided according to an embodiment of the present disclosure and the display device includes the display panel described in the first aspect.

BRIEF DESCRIPTION OF DRAWINGS

In order that technical solutions in embodiments of the present disclosure or the related art are described more clearly, drawings to be used in the description of the embodiments or the related art are briefly described hereinafter. Apparently, while the drawings in the description hereinafter are some embodiments of the present disclosure, for the person skilled in the art, these drawings may be expanded and extended to other structures and drawings according to the basic concepts of the device structure, driving method, and manufacturing method disclosed and indicated in embodiments of the present disclosure. These are undoubtedly all within the scope of the claims of the present disclosure.

DETAILED DESCRIPTION

In order for the object, technical solutions and advantages of the present disclosure to be clearer, the technical schemes of the present disclosure are described clearly and completely hereinafter with reference to the drawings through the embodiments. Apparently, the embodiments described below are part, not all, of the embodiments of the present disclosure. All other embodiments acquired by the person skilled in the art on the basis of basic concepts disclosed and suggested by the embodiments of the present disclosure fall within the scope of protection of the present disclosure.

Figure 1:
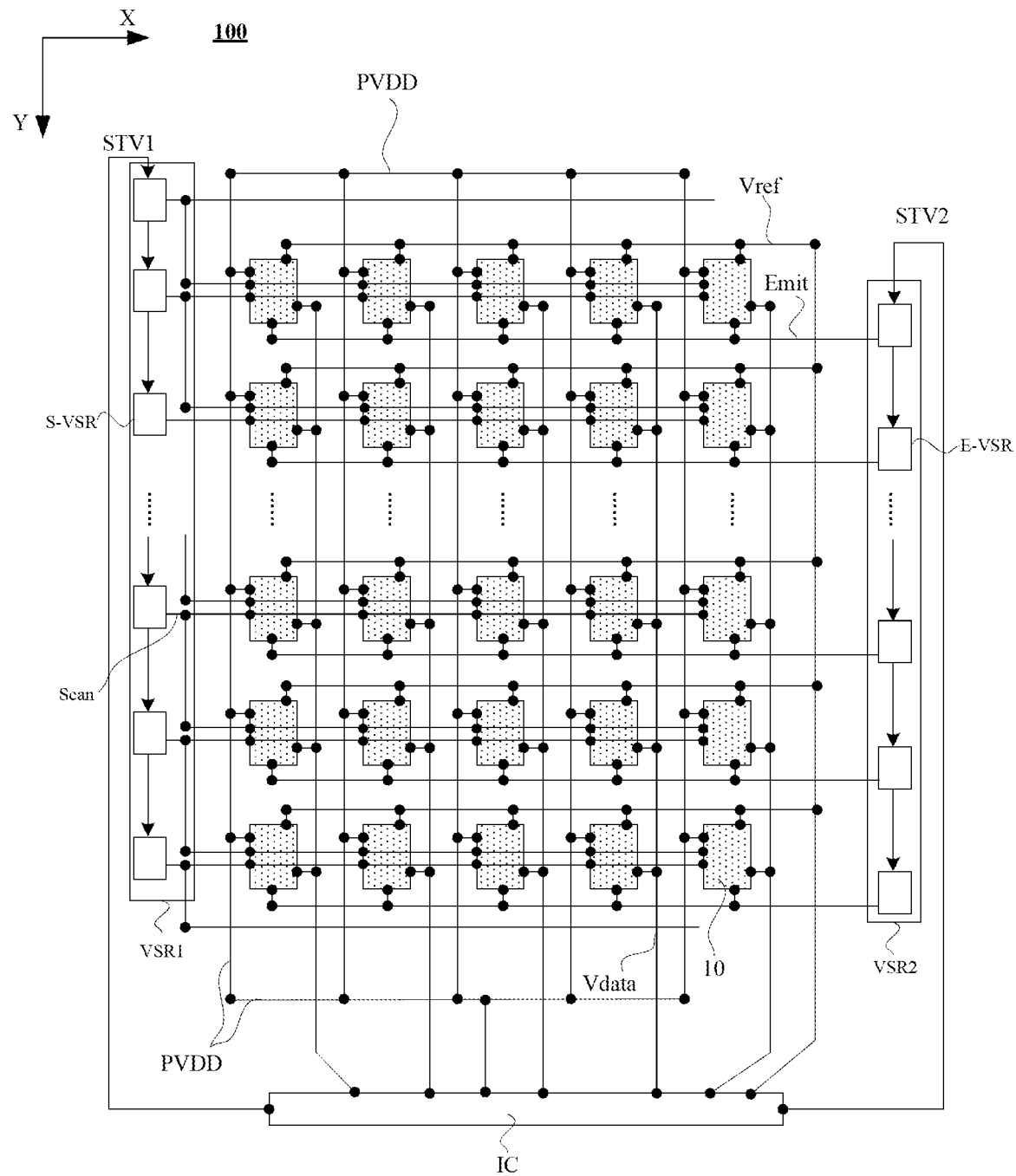
FIG. 1 is a structural diagram of a display panel according to an embodiment of the present disclosure.
Figure 2:
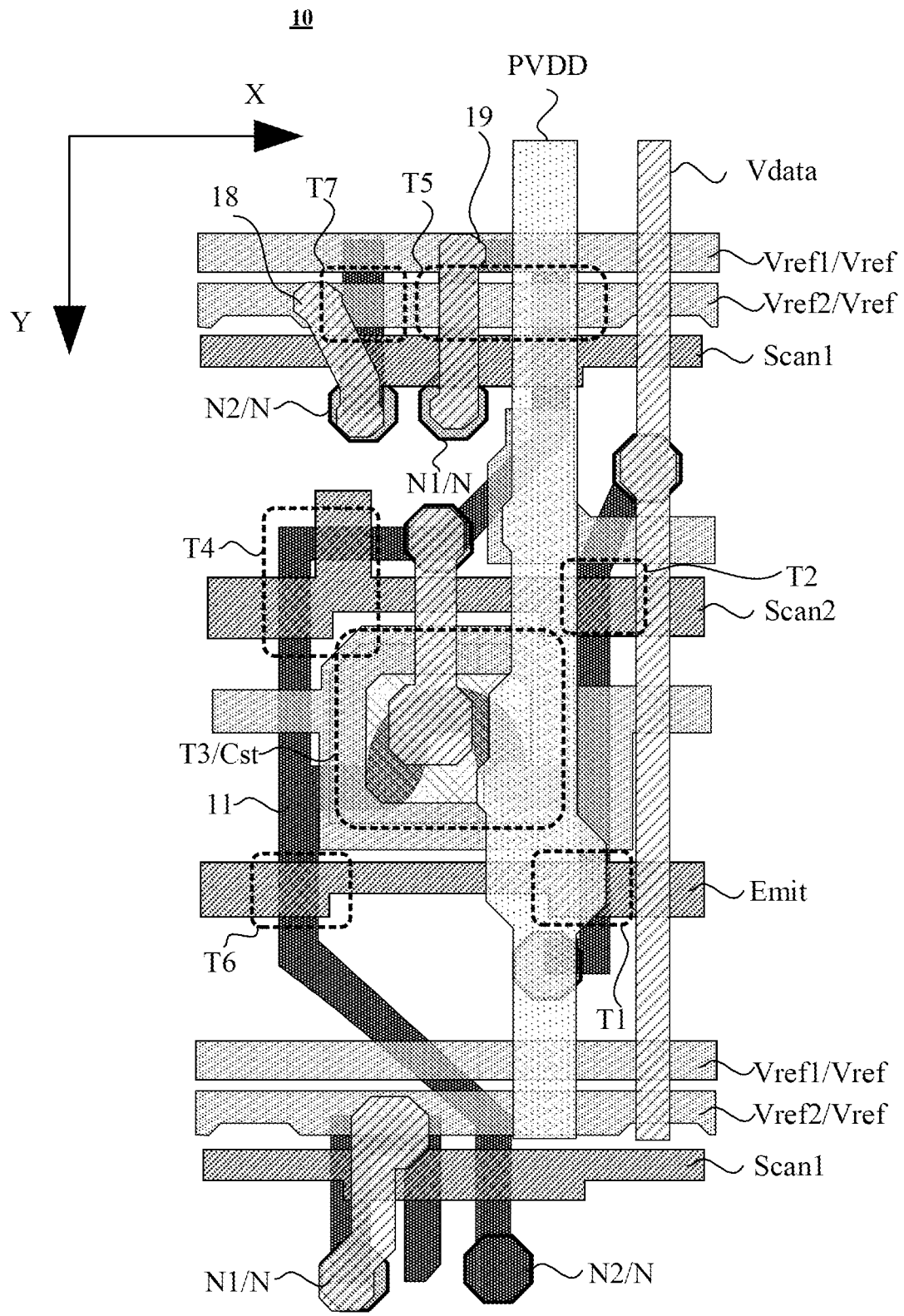
FIG. 2 is a schematic diagram of a structural layout of a pixel circuit according to an embodiment of the present disclosure.
Figure 3:
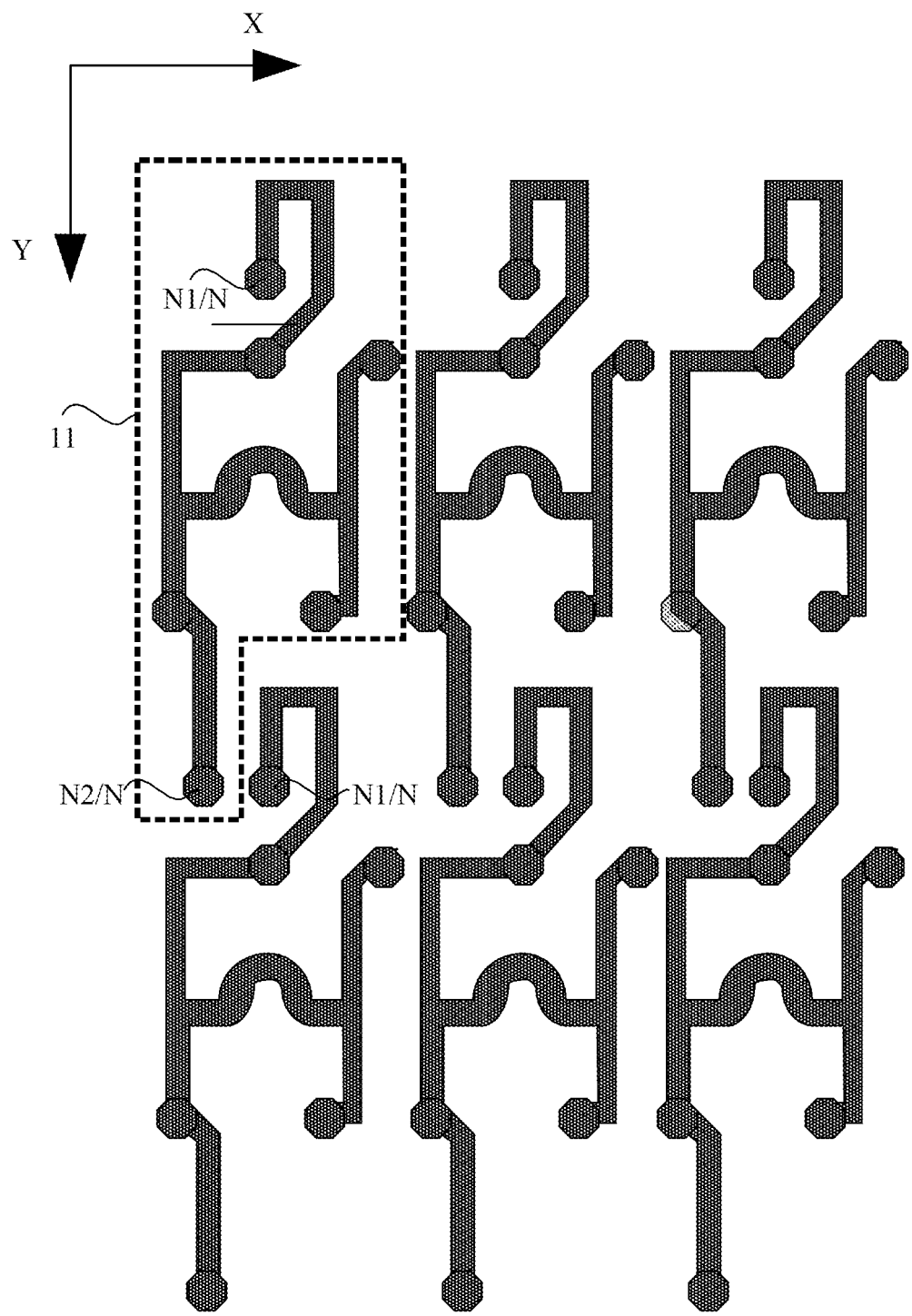
FIG. 3 is a structural diagram of a pixel driving semiconductor portion according to an embodiment of the present disclosure.

FIG. 1 is a structural diagram of a display panel according to an embodiment of the present disclosure, FIG. 2 is a schematic diagram of a structural layout of a pixel circuit according to an embodiment of the present disclosure, and FIG. 3 is a structural diagram of a pixel driving semiconductor portion according to an embodiment of the present disclosure. As shown in FIG. 1, FIG. 2, and FIG. 3, the display panel according to the embodiment of the present disclosure includes an array substrate 100, and the array substrate 100 includes multiple pixel circuits 10, a reference signal line Vref, and a pixel connecting semiconductor portion. The multiple pixel circuits are arranged in an array in a row direction (a direction X as shown in the figures) and a column direction (a direction Y as shown in the figures), each of the pixel circuits 10 includes a pixel driving semiconductor portion 11 including two fixed potential nodes N (N1 and N2 as shown in the figures), and the row direction intersects the column direction.

The fixed potential nodes N are electrically connected to the reference signal line Vref.

Two fixed potential nodes N adjacent in a first direction are connected by the pixel connecting semiconductor portion, and the first direction is parallel to a plane where the array substrate is located.

First, the basic structure of the display panel is described with reference to the structural diagram of the display panel shown in FIG. 1. As shown in FIG. 1, the array substrate 100 according to the embodiment of the present application includes multiple pixel circuits 10 which may be arranged in an array. For example, the multiple pixel circuits 10 may be arranged in an array in the row direction X and the column direction Y which intersect with each other.

Exemplarily, the array substrate 100 may further include a drive chip IC, a first gate driving circuit VSR1, a second gate driving circuit VSR2, a power signal line PVDD, a data signal line Vdata, a reference signal line Vref, scan signal lines Scan1 and Scan2, and a light emission control signal line Emit.

The first gate driving circuit VSR1 may include multiple cascaded shift registers S-VSRs, each shift register S-VSR is connected to pixel circuits 10 by a scan signal line, and the first gate driving circuit VSR1 is configured to provide a scan signal to the pixel circuits 10. The drive chip IC provides a first start signal STV1 to the first gate driving circuit VSR1. In addition, as shown in FIG. 1, in the multiple cascaded shift registers S-VSRs, except for a first stage of shift register S-VSR and a last stage of shift register S-VSR, the other shift registers S-VSR may provide scan signals for adjacent two rows of pixel circuits. In this case, two rows of dummy pixel circuits (not shown in FIG. 1) may be provided on the array substrate, which are respectively connected to a scanning line of the first stage of shift register S-VSR and a scanning line of the last stage of shift register S-VSR, but the dummy pixel circuits are not used for display.

The second gate driving circuit VSR2 may include multiple cascaded shift registers E-VSRs, each shift register E-VSR is connected to pixel circuits 10 by a light emission control signal line Emit, and the second gate driving circuit VSR2 is configured to provide a light emission control signal to the pixel circuits 10. The drive chip IC provides a second start signal STV2 to the second gate driving circuit VSR2.

In addition, a clock signal line (not shown in FIG. 1), a high-level signal line (VGH) (not shown in FIG. 1), and a low-level signal line (VGL) (not shown in FIG. 1) may be connected between the first gate driving circuit VSR1 and the drive chip IC and between the second gate driving circuit VSR2 and the drive chip IC. The drive chip IC provides clock signals, high-level signals, and low-level signals to the first gate driving circuit VSR1 and the second gate driving circuit VSR2 to ensure that the first gate driving circuit VSR1 can normally output scan signals, and the second gate driving circuit VSR2 can normally output light emission control signals.

Multiple different arrangements may be provided to the first gate driving circuit VSR1 and the second gate driving circuit VSR2. Exemplarily, as shown in FIG. 1, the array substrate 100 may include one first gate driving circuit VSR1 and one second gate driving circuit VSR2. The first gate driving circuit VSR1 and the second gate driving circuit VSR2 may be arranged on two opposite sides of the array substrate 100 in a second direction Y. The first gate driving circuit VSR1 and the second gate driving circuit VSR2 may also be arranged on the same side. For another example, the array substrate 100 may include two first gate driving circuits VSR1s and two second gate driving circuits VSR2s. Each of two ends of the scan signal line is electrically connected to one first gate driving circuit VSR1, and each of two ends of the light emission control signal line Emit is electrically connected to one second gate driving circuit VSR2, so as to ensure good consistency of the scan signal in the scan signal line and the light emission control signal in the light emission control signal line. For another example, the array substrate 100 includes two first gate driving circuits VSR1s, one of the first gate driving circuits VSR1s is electrically connected to pixel circuits in odd-numbered rows through scan signal lines, and the other one of first gate driving circuit VSR1 is electrically connected to pixel circuits in even-numbered rows through scan signal lines, thereby ensuring that the first gate driving circuits VSR1s each have a simple structure. For another example, the array substrate 100 includes two second gate driving circuits VSR2s, one of the second gate driving circuits VSR2s is electrically connected to pixel circuits in odd-numbered rows through light emission control signal lines, and the other one of second gate driving circuits VSR2s is electrically connected to pixel circuits in even-numbered rows through light emission control signal lines, thereby ensuring that the second gate driving circuits VSR2s each have a simple structure. The specific arrangements of the first gate driving circuit VSR1 and the second gate driving circuit VSR2 are not described in the embodiments of the present disclosure. The above description of the first gate driving circuit VSR1 and the second gate driving circuit VSR2 is merely a few examples and is not intended to limit the present application. It is only necessary to ensure that the scan signal and the light emission control signal can be normally provided. Exemplarily, a gate driving circuit capable of generating both a scan signal and a light emission control signal may be provided.

Figure 4:
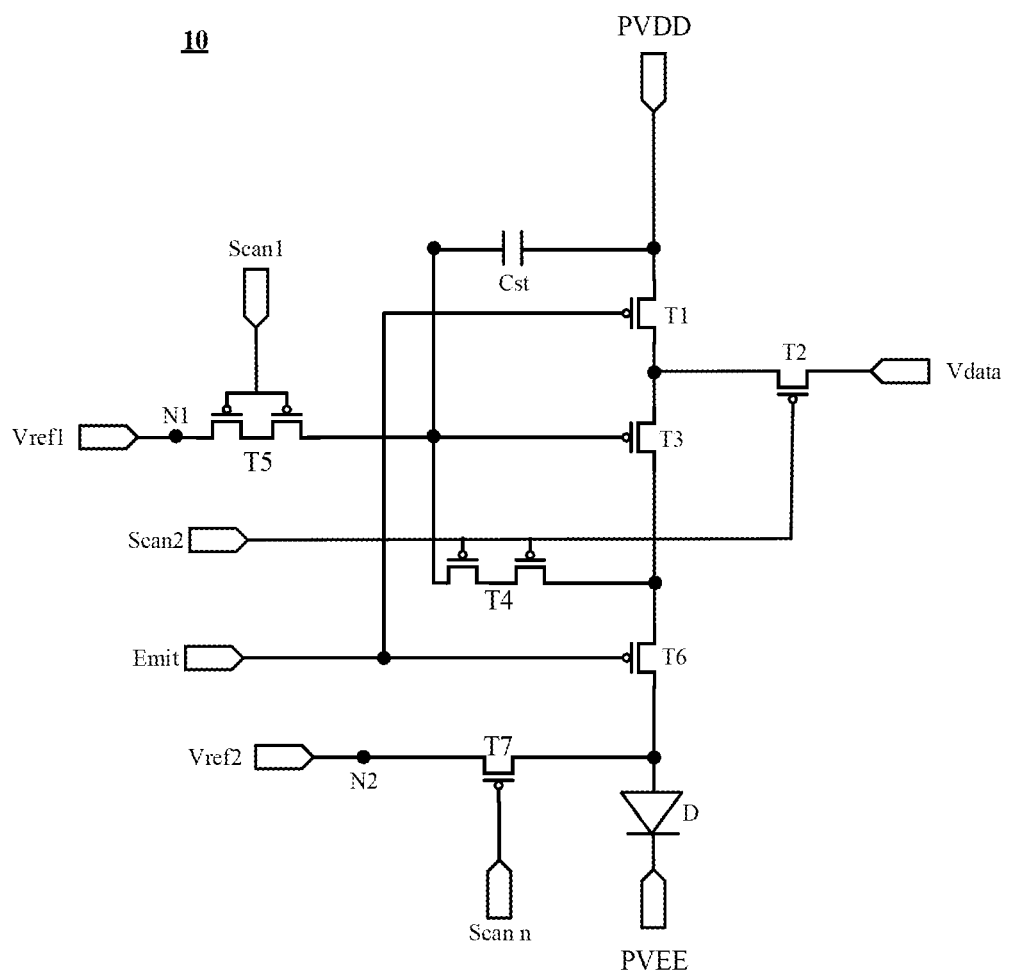
FIG. 4 is a schematic diagram of a circuit structure of a pixel circuit according to an embodiment of the present disclosure.
Figure 5:
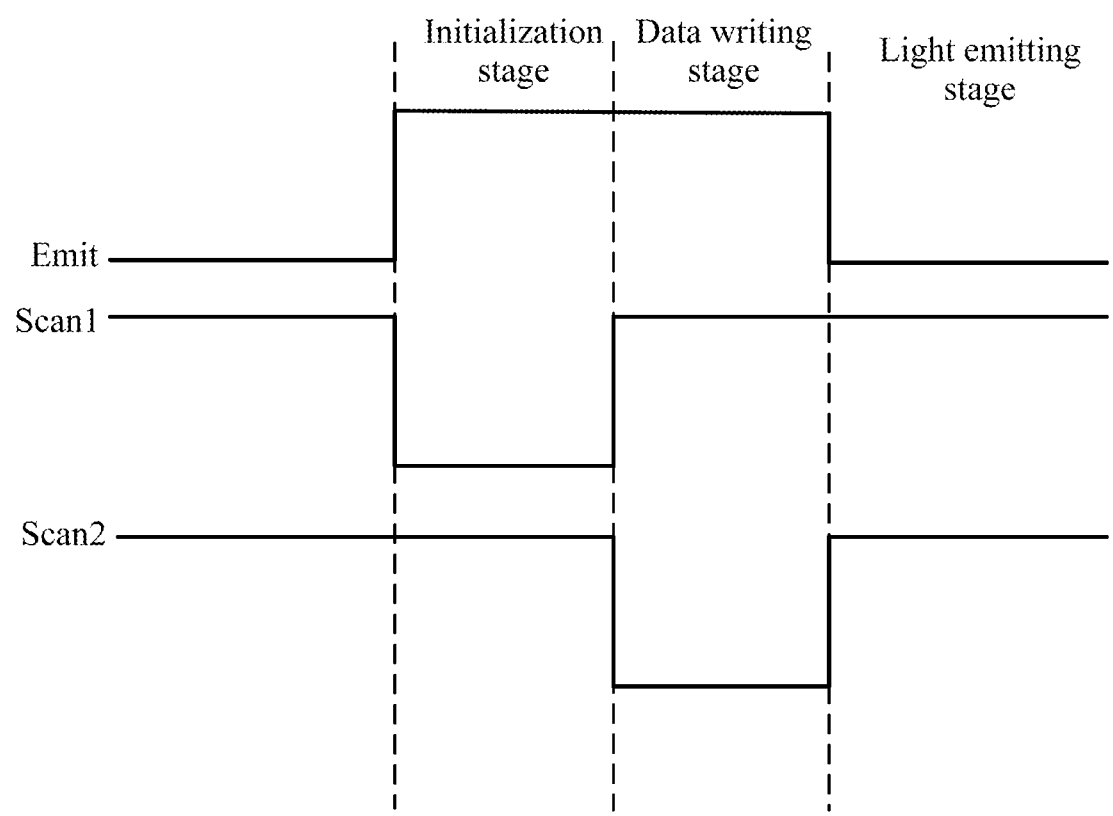
FIG. 5 is a schematic diagram of timing sequences of a scan signal and a light emission control signal in the pixel circuit of FIG. 4.

Further, FIG. 4 is a structural diagram of a circuit structure of a pixel circuit according to an embodiment of the present disclosure, and FIG. 5 is a schematic diagram of timing sequences of a scan signal and a light emission control signal in the pixel circuit in FIG. 4. Referring to FIG. 2, FIG. 4, and FIG. 5, each pixel circuit may include multiple thin-film transistors. In FIG. 2 and FIG. 4, it is taken as an example for illustration that the pixel circuit includes seven thin-film transistors and one storage capacitor, that is, a 7T1C circuit. With reference to FIG. 2, FIG. 4, and FIG. 5, the operation process of the pixel circuit is briefly described hereinafter. Referring to FIG. 2 and FIG. 4, taking any row of pixel circuits as an example, a first scan signal line Scan1 controls a first reset transistor T5 of the pixel circuit to be turned on or turned off, and resets a gate potential of a drive transistor T3 when the first reset transistor T5 is turned on. A second scan signal line Scan2 controls a data writing transistor T2 and a threshold compensation transistor T4 of the pixel circuit to be turned on and turned off, and writes a data signal on the data signal line Vdata to a gate of the drive transistor T3 and compensates a threshold voltage of the drive transistor T3 when the data writing transistor T2 and the threshold compensation transistor T4 are turned on. In some pixel circuit designs, the scan signal Scan n may also be used for controlling a second reset transistor T7 of the pixel circuit to be turned on or turned off, and to reset an anode potential of a light-emitting element when the second reset transistor T7 is turned on. In this case, it is not necessary to provide a scan signal line for the second reset transistor T7 separately.

In other words, the first scan signal line may be understood as a scan signal line connected to a control terminal of the first reset transistor in the pixel circuit 10, and the second scan signal line may be understood as a scan signal line connected to a control terminal of the data writing transistor, a control terminal of the compensation transistor and a control terminal of the second reset transistor in the pixel circuit 10. Generally, each row of pixel circuits 10 for display is connected to at least the first scan signal line and the second scan signal line correspondingly.

The power signal line PVDD is configured to provide a power voltage to the drive transistor T3, and the voltage on the power signal line PVDD may be a positive voltage. The voltage on a common power signal terminal PVEE may be a negative voltage. The reference signal line Vref is configured to provide a reset voltage signal, and the voltage on the reference signal line Vref may be a negative voltage.

The above-described embodiment is described by taking each transistor in the pixel circuit 10 being a P-type transistor as an example. In another optional embodiment, each transistor in the pixel circuit 10 may be an N-type transistor or a part of the transistors in the pixel circuit 10 may be P-type transistors and a part of the transistors in the pixel circuit 10 may be N-type transistors. Different enable levels may be provided according to different types of transistors, where the enable level is a level capable of turning on the transistor. Exemplarily, the enable level is a high-level for an N-type transistor and a low level for a P-type transistor.

As shown in FIG. 5, a driving process of the pixel circuit 10 may include an initialization stage, a data writing stage and a light emitting stage. In the initialization stage, the first scan signal line Scan1 provides a low-level signal and the first reset transistor T5 is turned on to reset the gate potential of the drive transistor T3. In the data writing stage, the second scan signal line Scan2 provides a low-level signal, the data writing transistor T2 and the threshold compensation transistor T4 are turned on, and the data signal on the data signal line Vdata is written to the gate of the drive transistor T3 to compensate the threshold voltage of the drive transistor T3; and the second reset transistor T7 is turned on to rest the anode potential of the light-emitting element. In the light emitting stage, the light emission control signal line Emit provides a low-level signal, the light emission control transistors T1 and T6 are turned on, a driving current generated by the drive transistor T3 is transmitted to the light-emitting element, and the light-emitting element emits light.

It is to be noted that FIG. 2, FIG. 4 and FIG. 5 are merely examples and are not intended to limit the present application.

On the basis of the above-described embodiment, with continued reference to FIG. 2 and FIG. 3, the pixel driving semiconductor portion 11 may be an active layer in a thin-film transistor FIG. 3 exemplarily shows the pixel driving semiconductor portion 11 in 2 rows*3 columns of pixel circuits 10. Referring to FIG. 2 and FIG. 3, the pixel driving semiconductor portion 11 includes two fixed potential nodes N such as N1 and N2 shown in FIGS. 2 and 3, and the two fixed potential nodes N1 and N2 may be connected to input terminals of different thin-film transistors, for example, the first node N1 is connected to an input terminal (a source or a drain) of the first reset transistor T5, and the second node N2 is connected to an input terminal (a source or a drain) of the second reset transistor T7. The two fixed potential nodes N1 and N2 are electrically connected to the reference signal line Vref and are configured to receive a reference signal provided by the reference signal line Vref and reset the gate of the drive transistor T3 in the pixel circuit and reset the light-emitting element D in the display panel, so as to ensure that the current display state of the display panel is not affected by the previous display state and ensure that the display effect is good. In this embodiment of the present disclosure, the pixel driving semiconductor portion 11 includes two fixed potential nodes N1 and N2, so that a large adjustment space in adjusting the pixel driving semiconductor portion can be ensured by adjusting the two fixed potential nodes N1 and N2. Thus, the performance of the pixel driving semiconductor portion can be improved from multiple dimensions, which facilitates the improvement of the performance of the pixel driving semiconductor portion from the multiple dimensions and the improvement of the performance of the entire pixel circuit and the display panel. Moreover, the display panel according to the embodiment of the present disclosure further includes the pixel connecting semiconductor portion (not shown in FIG. 2 and FIG. 3), two adjacent fixed potential nodes arranged in the first direction are electrically connected by the pixel connecting semiconductor portion, so as to facilitate the signal transmission between the two fixed potential nodes, the improvement of signal consistency in the pixel driving semiconductor portion and the improvement of the display effect of the display panel.

It should be noted that the specific orientation of the first direction is not limited in the embodiment of the present disclosure, and the first direction may be the row direction, the column direction, or a direction whose included angle with the row direction or the column direction is an acute angle. The first direction will be described in detail in accordance with specific arrangements of the pixel connecting semiconductor portion subsequently.

In summary, in the display panel according to the embodiment of the present disclosure, two fixed potential nodes are provided for the pixel driving semiconductor portion, and both of the two fixed potential nodes are electrically connected to the reference signal line to reset the light-emitting element and some nodes in the pixel circuit, thereby ensuring that the current display state of the display panel is not affected by the previous display state and ensuring that the display effect is good. Further, the pixel driving semiconductor portion includes two fixed potential nodes so that the adjustment space in the later adjustment of the pixel driving semiconductor portion is relatively large, which facilitates improving the performance of the pixel driving semiconductor portion from multiple dimensions and improving the performance of the entire pixel circuit and the display panel. Moreover, the display panel according to the embodiment of the present disclosure further includes the pixel connecting semiconductor portion, and two adjacent fixed potential nodes arranged in the first direction are electrically connected by the pixel connecting semiconductor portion, so as to facilitate the signal transmission between the two fixed potential nodes and improving the signal consistency in the pixel driving semiconductor portion and the display effect of the display panel.

On the basis of the above embodiment, with continued reference to FIG. 2 and FIG. 4, the pixel circuit 10 includes the drive transistor T3, the light-emitting element D, the first reset transistor T5 and the second reset transistor T7. The drive transistor T3 is configured to control the light-emitting element D to light up, the first reset transistor T5 is configured to control the reference signal to reset the gate potential of the drive transistor T3, and the second reset transistor T7 is configured to control the reference signal to reset the anode potential of the light-emitting element D.

The array substrate 100 further includes the first scan signal line Scan1 extending in the row direction, there are two overlapping regions between the first scan signal line Scan1 and the pixel driving semiconductor portions 11 in a direction perpendicular to a plane where the array substrate 100 is located, and a channel of the first reset transistor T5 and a channel of the second reset transistor T7 respectively include pixel driving semiconductor portions where the two overlapping regions are located.

The two fixed potential nodes N include the first node N1 and the second node N2. One terminal of the first reset transistor T5 is electrically connected to the first node N1, and another terminal of the first reset transistor T5 is electrically connected to the gate of the drive transistor T3. One terminal of the second reset transistor T7 is electrically connected to the second node N2, and another terminal of the second reset transistor T7 is electrically connected to the anode of the light-emitting element D.

Exemplarily, as shown in FIG. 2, the regions where the first scan signal line Scan' overlaps with the pixel driving semiconductor portions 11 in the direction perpendicular to the plane where the array substrate 100 is located are the first reset transistor T5 and the second reset transistor T7. It is to be noted that the first reset transistor T5 and the second reset transistor T7 are the first reset transistor T5 and the second reset transistor T7 in two pixel circuits adjacent in the column direction, that is, the first reset transistor T5 is the first reset transistor T5 in the pixel circuit at the present stage, and the second reset transistor T7 is the second reset transistor T7 in the pixel circuit at the previous stage. When a scan signal is transmitted on the first scan signal line Scan1, the first reset transistor T5 in the pixel circuit at the present stage is configured to reset the gate of the drive transistor T3 in the pixel circuit at the present stage according to a received reference signal, and meanwhile, the second reset transistor T7 in the pixel circuit at the previous stage is configured to reset the anode of the light-emitting element corresponding to the pixel circuit at the previous stage according to a received reference signal.

Next, in accordance with the foregoing description of the pixel circuit and the pixel driving semiconductor portion, the specific arrangements of the reference signal line and the pixel connecting semiconductor portion are described in detail.

Figure 6:
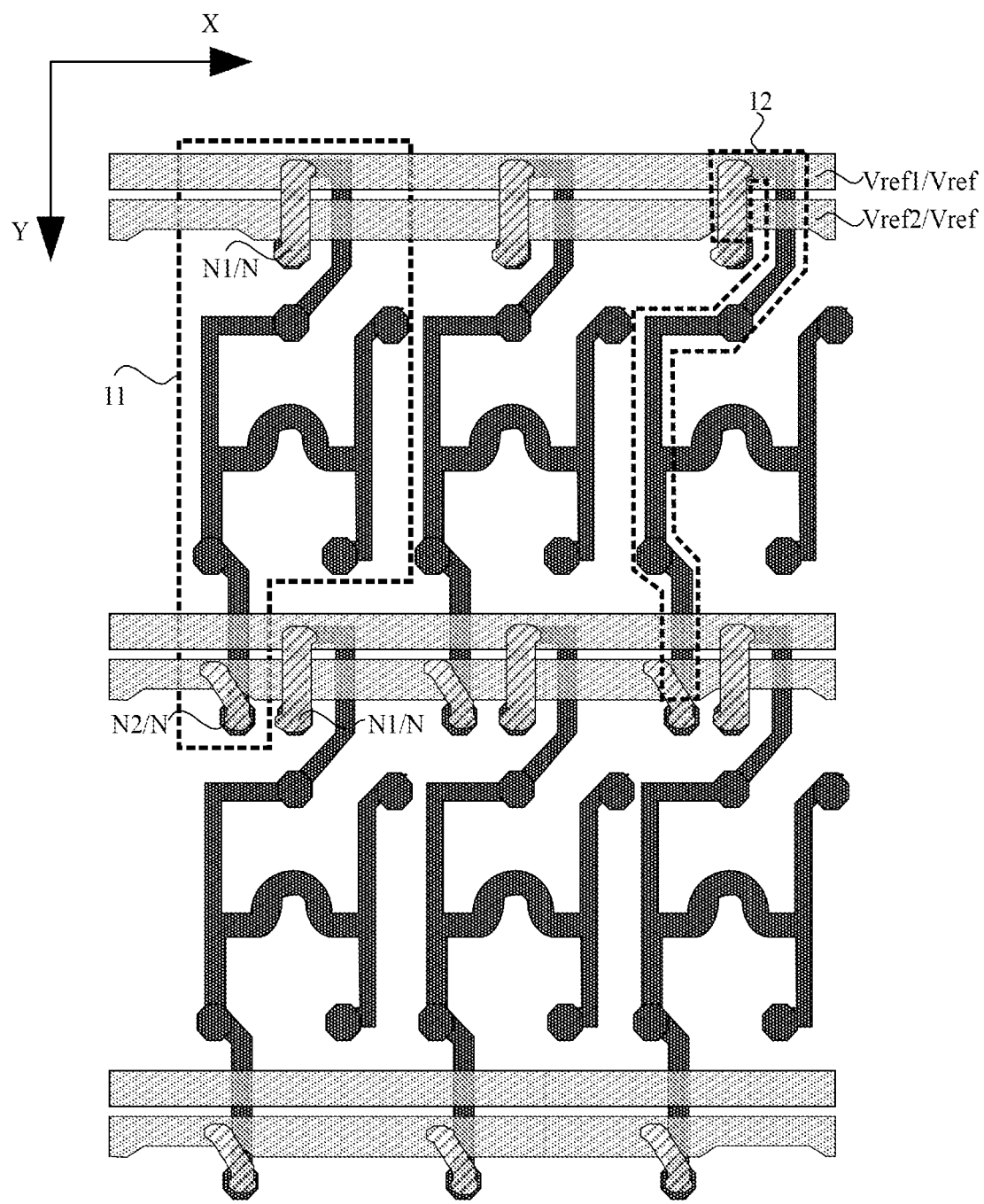
FIG. 6 is a structural diagram of a pixel driving semiconductor portion, a pixel connecting semiconductor portion, and a reference signal line according to an embodiment of the present disclosure.

As an implementable embodiment, FIG. 6 is a structural diagram of a pixel driving semiconductor portion, a pixel connecting semiconductor portion, and a reference signal line according to an embodiment of the present disclosure. Referring to FIG. 2 and FIG. 6, the reference signal line Vref includes a first reference signal line Vref1 and a second reference signal line Vref2 that extend in the row direction and are parallel to each other; the two fixed potential nodes include the first node N1 and the second node N2; and in the same pixel driving semiconductor portion 11, the first node N1 is electrically connected to the first reference signal line Vref1, and the second node N2 is electrically connected to the second reference signal line Vref2.

The pixel driving semiconductor portion 11 includes the pixel connecting semiconductor portion 12, and the first node N1 and the second node N2 in the same pixel driving semiconductor portion 11 are electrically connected by the pixel connecting semiconductor portion 12.

Exemplarily, it can be known from the above description that the reference signal received by the first node N1 is used for resetting the gate of the drive transistor T3, and the reference signal received by the second node N2 is used for resetting the anode of the light-emitting element. Therefore, the first node N1 and the second node N2 are required to receive different reference signals due to the different structures to be reset. Accordingly, in the embodiment of the present disclosure, the reference signal line Vref includes the first reference signal line Vref1 and the second reference signal line Vref2 that extend in the row direction and are parallel to each other; and the two fixed potential nodes include the first node N1 and the second node N2; and in the same pixel driving semiconductor portion 11, the first node N1 is electrically connected to the first reference signal line Vref1, the second node N2 is electrically connected to the second reference signal line Vref2, and the first reference signal line Vref1 and the second reference signal line Vref2 can provide different reference signals to ensure separate reset of the gate of the drive transistor T3 and the anode of the light-emitting element and ensure good reset effect of the gate of the drive transistor T3 and the anode of the light-emitting element.

Further, with continued reference to FIG. 2 and FIG. 6, the pixel driving semiconductor portion 11 may include the pixel connecting semiconductor portion 12, that is, the pixel connecting semiconductor portion 12 is a part of the pixel driving semiconductor portion 11. Specifically, the pixel connecting semiconductor portion 12 is a part of the same pixel driving semiconductor portion 11 for connecting the first node N1 and the second node N2. In this way, it is not necessary to add a fabrication process of the pixel connecting semiconductor portion 12, the pixel connecting semiconductor portion 12 is provided in a simple manner, and the fabrication process is simple.

Figure 7:
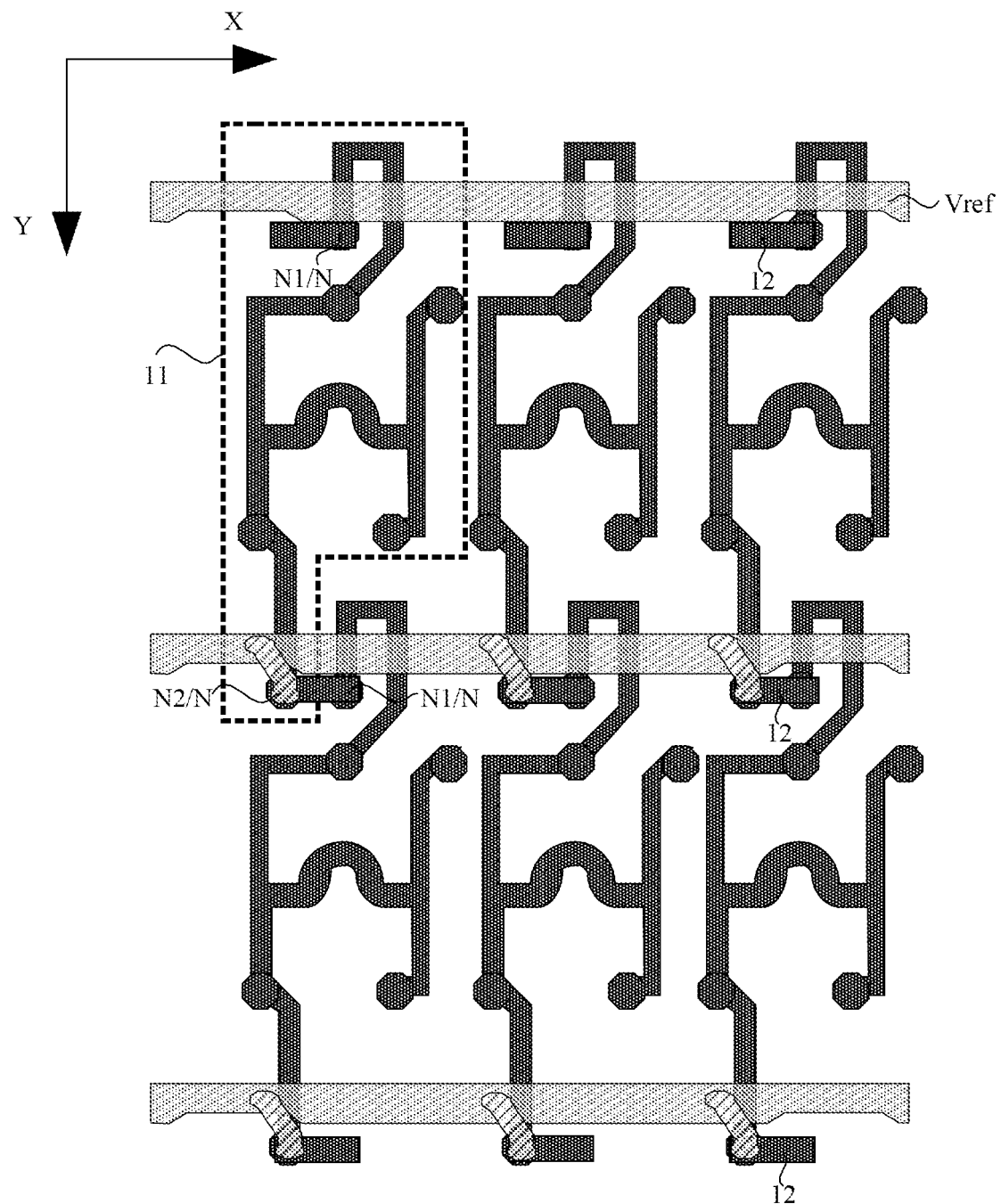
FIG. 7 is a structural diagram of another pixel driving semiconductor portion, pixel connecting semiconductor portion and reference signal line according to an embodiment of the present disclosure.
Figure 8:
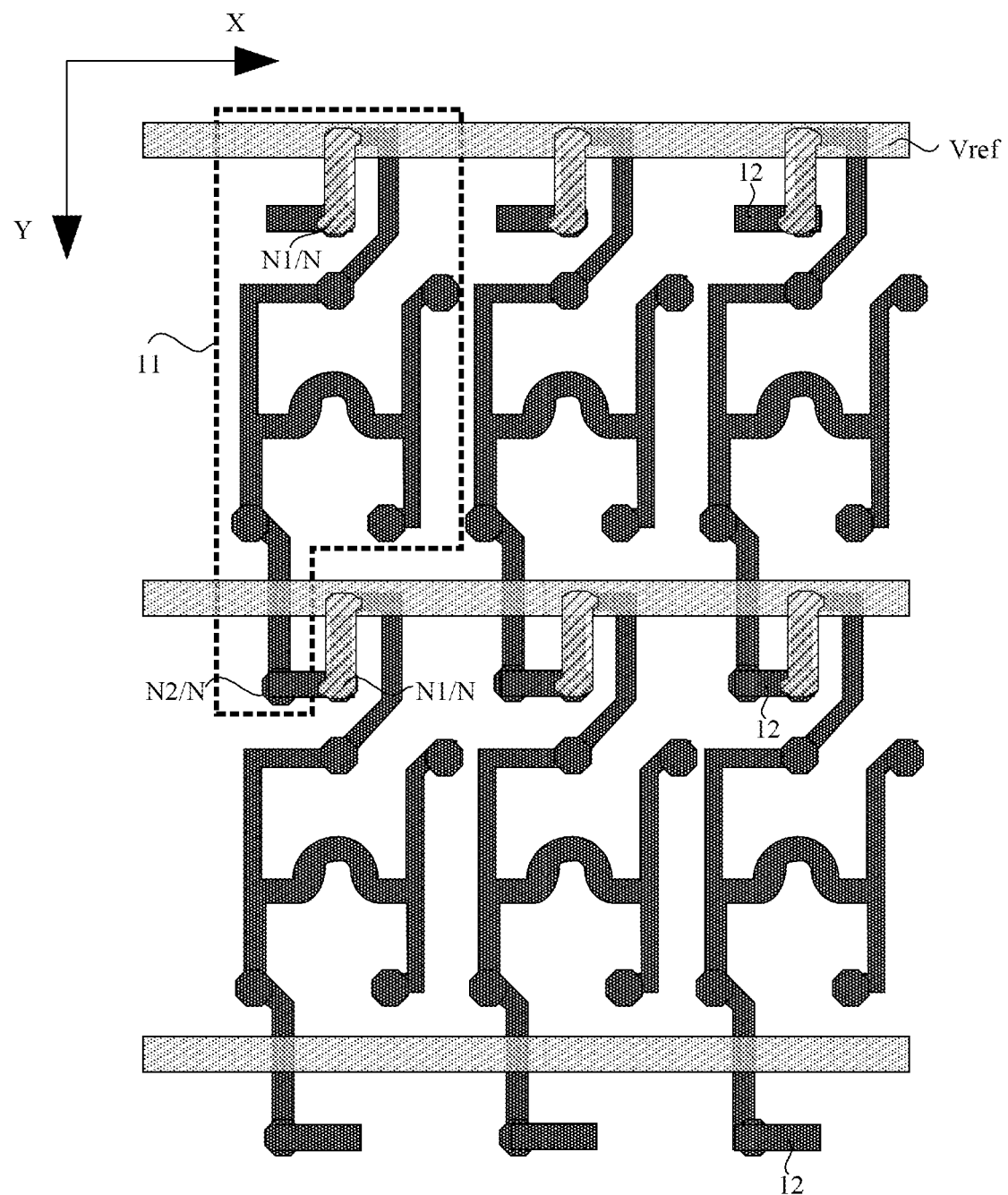
FIG. 8 is a structural diagram of another pixel driving semiconductor portion, pixel connecting semiconductor portion and reference signal line according to an embodiment of the present disclosure.

As another implementable embodiment, FIG. 7 is a structural diagram of another pixel driving semiconductor portion, pixel connecting semiconductor portion and reference signal line according to an embodiment of the present disclosure, and FIG. 8 is a structural diagram of another pixel driving semiconductor portion, pixel connecting semiconductor portion and reference signal line according to an embodiment of the present disclosure. As shown in FIG. 7 and FIG. 8, two fixed potential nodes N include the first node N1 and the second node N2. As shown in FIG. 7, the second node N2 is electrically connected to the reference signal line Vref, and the first node N1 is electrically connected to the reference signal line Vref through the pixel connecting semiconductor portion 12 and the second node N2; alternatively, as shown in FIG. 8, the first node N1 is electrically connected to the reference signal line Vref, and the second node N2 is electrically connected to the reference signal line Vref through the pixel connecting semiconductor portion 12 and the first node N1.

Among multiple pixel driving semiconductor portions 11 arranged sequentially in the column direction, the second node N2 in the pixel driving semiconductor portion 11 at the current stage is electrically connected to the first node N1 in the pixel driving semiconductor portion 11 at the next stage by the pixel connecting semiconductor portion 12.

It can be known from the above that the reference signal provided by the reference signal line Vref may be a negative potential signal which may reset both the first node N1 and the second node N2. As shown in FIG. 7 and FIG. 8, only one reference signal line Vref is provided, which can ensure that the arrangement manner of the reference signal line Vref is simple.

Further, the first node N1 may be directly electrically connected to the reference signal line Vref, and in this case, the second node N2 may be electrically connected to the reference signal line Vref through the pixel connecting semiconductor portion 12 and the first node N1, as shown in FIG. 8; alternatively, the second node N2 may be directly electrically connected to the reference signal line Vref, and in this case, the first node N1 may be electrically connected to the reference signal line Vref through the pixel connecting semiconductor portion 12 and the second node N2, as shown in FIG. 7. Thus, it can be achieved that both the first node N1 and the second node N2 are electrically connected to the reference signal line Vref, so as to ensure that the gate of the drive transistor and the anode of the light-emitting element can be reset and ensure that the display panel can display normally.

Further, with continued reference to FIG. 7 and FIG. 8, among the multiple pixel driving semiconductor portions 11 arranged sequentially in the column direction, the second node N2 in the pixel driving semiconductor portion 11 at the current stage is electrically connected to the first node N1 in the pixel driving semiconductor portion 11 at the next stage by the pixel connecting semiconductor portion 12, and thus the multiple pixel driving semiconductor portions 11 are connected in the column direction by the pixel connecting semiconductor portions 12 to form a continuous semiconductor trace. In this way, static electricity can be uniformly distributed on the continuous semiconductor trace, and further, the reliability and uniformity of the performance of the pixel driving semiconductor portions 11 in the subsequent high-temperature fabrication process can be improved. Therefore, the driving capabilities of the pixel circuits can be substantially consistent, the display uniformity can be achieved, and the display effect can be improved.

Further, the pixel connecting semiconductor portion 12 and the pixel driving semiconductor portion 11 may be disposed in the same layer, made of the same material and fabricated in the same process, thereby ensuring that the display panel has a simple structure and a simple fabrication process.

Figure 9:
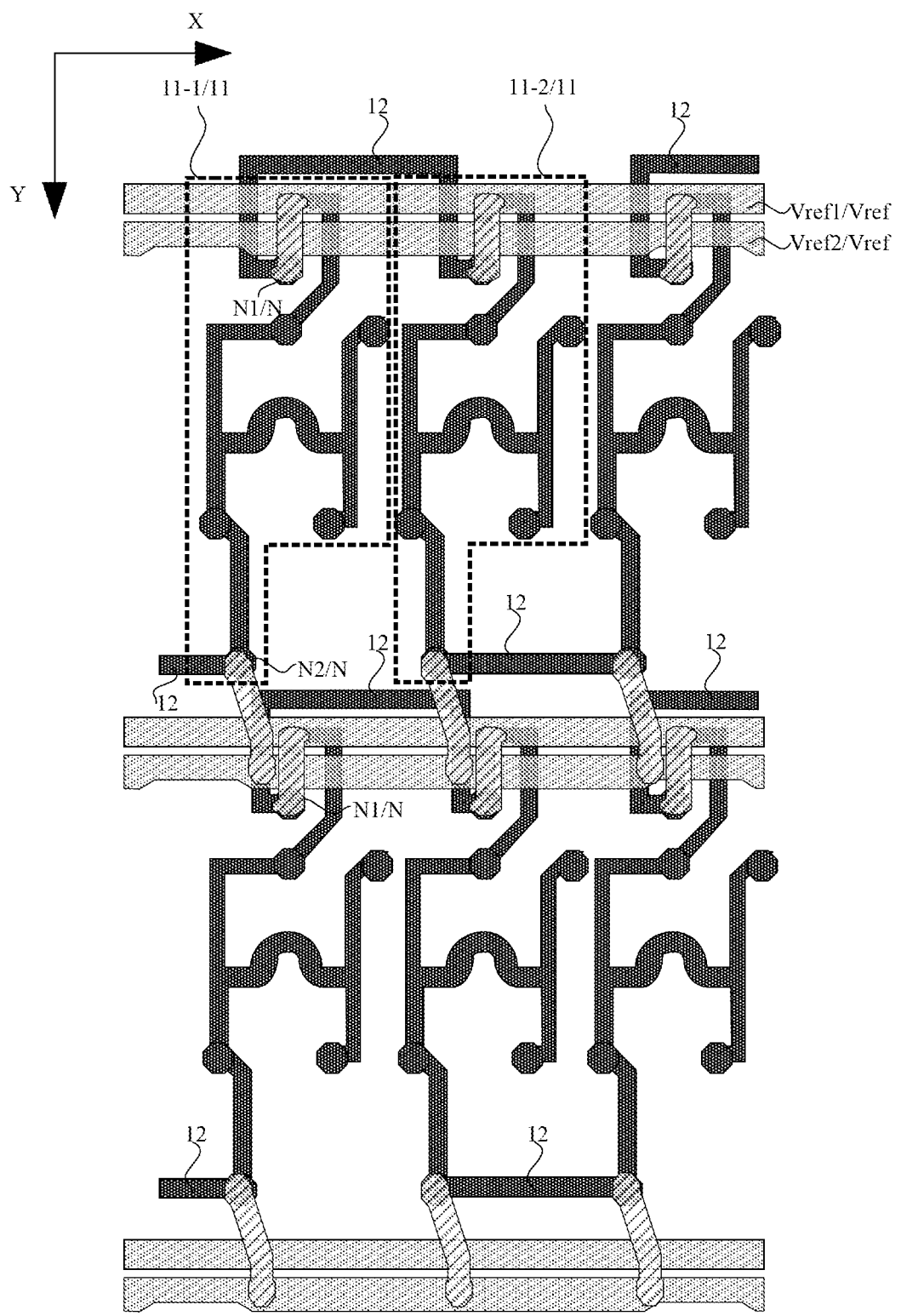
FIG. 9 is a structural diagram of another pixel driving semiconductor portion, pixel connecting semiconductor portion and reference signal line according to an embodiment of the present disclosure.
Figure 10:
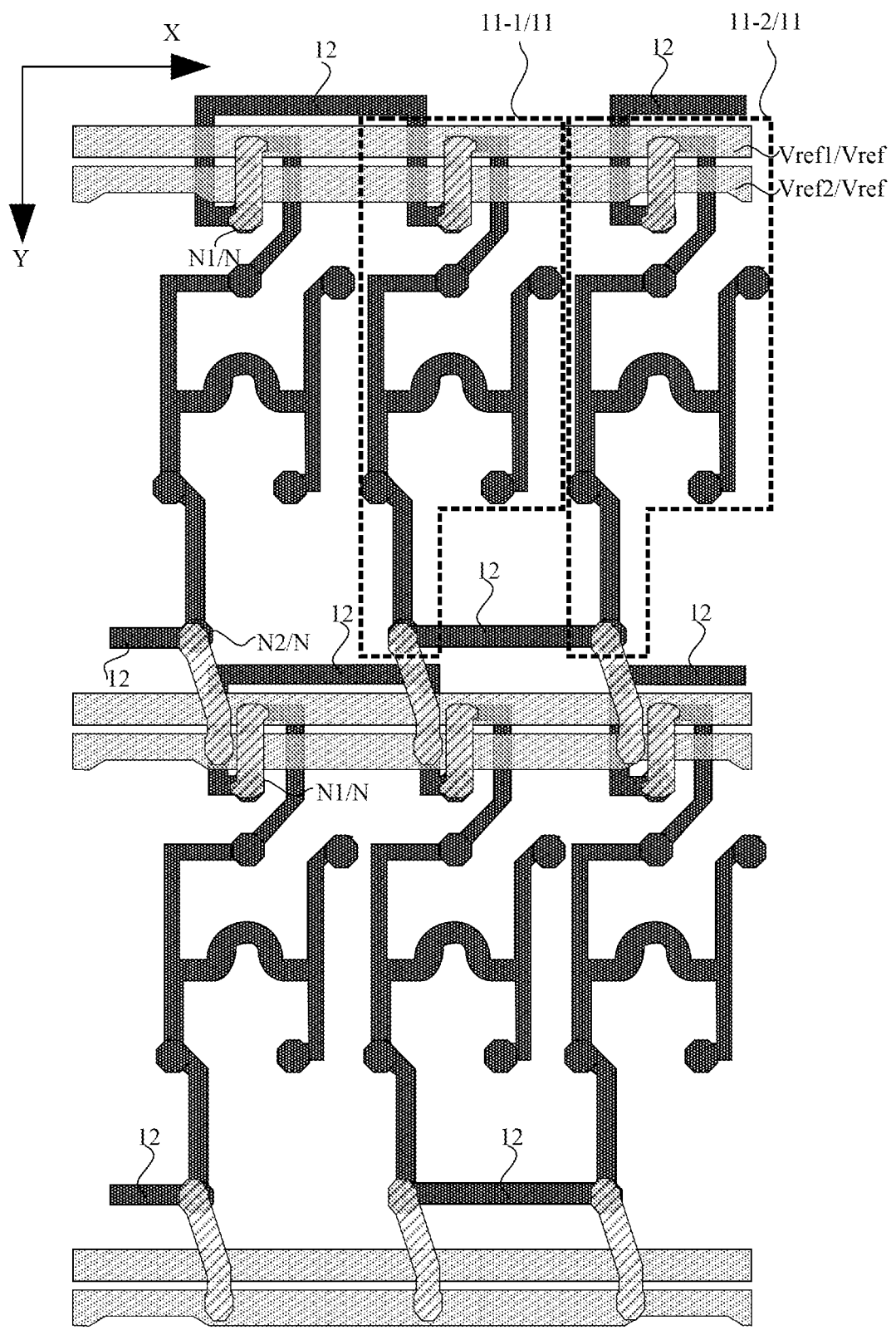
FIG. 10 is a structural diagram of another pixel driving semiconductor portion, pixel connecting semiconductor portion and reference signal line according to an embodiment of the present disclosure.

As another implementable embodiment, FIG. 9 is a structural diagram of another pixel driving semiconductor portion, pixel connecting semiconductor portion and reference signal line according to an embodiment of the present disclosure, and FIG. 10 is a structural diagram of another pixel driving semiconductor portion, pixel connecting semiconductor portion and reference signal line according to an embodiment of the present disclosure. As shown in FIG. 9 and FIG. 10, the reference signal line Vref includes the first reference signal line Vref1 and the second reference signal line Vref2 that extend in the row direction and are parallel to each other, and two fixed potential nodes N include the first node N1 and the second node N2. In the same pixel driving semiconductor portion 11, the first node N1 is electrically connected to the first reference signal line Vref1, and the second node N2 is electrically connected to the second reference signal line Vref2.

Two pixel driving semiconductor portions 11 adjacent in the row direction include a first pixel driving semiconductor portion 11-1 and a second pixel driving semiconductor portion 11-2, and the first node N1 in the first pixel driving semiconductor portion 11-1 is electrically connected to the first node N1 in the second pixel driving semiconductor portion 11-2 by the pixel connecting semiconductor portion 12, or the second node N2 in the first pixel driving semiconductor portion 11-1 is electrically connected to the second node N2 in the second pixel driving semiconductor portion 11-2 by the pixel connecting semiconductor portion.

Exemplarily, it can be known from the above description that the reference signal received by the first node N1 is used for resetting the gate of the drive transistor T3, and the reference signal received by the second node N2 is used for resetting the anode of the light-emitting element. Therefore, the first node N1 and the second node N2 are required to receive different reference signals due to the different structures to be reset. Accordingly, in the embodiment of the present disclosure, the reference signal line Vref includes the first reference signal line Vref1 and the second reference signal line Vref2 that extend in the row direction and are parallel to each other; and the two fixed potential nodes include the first node N1 and the second node N2; and in the same pixel driving semiconductor portion 11, the first node N1 is electrically connected to the first reference signal line Vref1, the second node N2 is electrically connected to the second reference signal line Vref2, and the first reference signal line Vref1 and the second reference signal line Vref2 can provide different reference signals to ensure separate reset of the gate of the drive transistor T3 and the anode of the light-emitting element and ensure good reset effect of the gate of the drive transistor T3 and the anode of the light-emitting element.

Further, as shown in FIG. 9, in two adjacent pixel driving semiconductor portions 11 arranged in the row direction, the first node N1 in the first pixel driving semiconductor portion 11-1 is electrically connected to the first node N1 in the second pixel driving semiconductor portion 11-2 by the pixel connecting semiconductor portion 12; and as shown in FIG. 10, in the two adjacent pixel driving semiconductor portions 11 arranged in the row direction, the second node N2 in the first pixel driving semiconductor portion 11-1 is electrically connected to the second node N2 in the second pixel driving semiconductor portion 11-2 by the pixel connecting semiconductor portion. Thus, multiple pixel driving semiconductor portions 11 are connected to each other in the row direction by the pixel connecting semiconductor portions 12 to form a continuous semiconductor trace. In this way, static electricity can be uniformly distributed on the continuous semiconductor trace, and further, the reliability and uniformity of the performance of the pixel driving semiconductor portions 11 in the subsequent high-temperature fabrication process can be improved. Therefore, the driving capabilities of the pixel circuits can be substantially consistent, the display uniformity can be achieved, and the display effect can be improved.

It is to be noted that the difference between FIG. 9 and FIG. 10 is only in that the first pixel driving semiconductor portion 11-1 and the second pixel driving semiconductor portion 11-2 are determined in different manners. It can be known from FIG. 9 and FIG. 10 that the difference between FIG. 9 and FIG. 10 is only in that the first pixel driving semiconductor portion 11-1 in FIG. 9 corresponds to the second pixel driving semiconductor portion 11-2 in FIG. 10, and the second pixel driving semiconductor portion 11-2 in FIG. 9 corresponds to the first pixel driving semiconductor portion 11-1 in FIG. 10. Therefore, in the structure shown in FIG. 9 and the structure shown in FIG. 10, multiple pixel driving semiconductor portions 11 can be connected to each other in the row direction by the pixel connecting semiconductor portions 12 to form a continuous semiconductor trace, thereby ensuring that the driving capabilities of the pixel circuits are substantially consistent, achieving the display uniformity, and improving the display effect.

Further, the pixel connecting semiconductor portion 12 and the pixel driving semiconductor portion 11 may be disposed in the same layer, made of the same material and are fabricated in the same process, thereby ensuring that the display panel has a simple structure and a simple fabrication process.

On the basis of the above-described embodiments, there may be multiple different arrangement manners in which multiple pixel driving semiconductor portions 11 can be connected to each other in the row direction by the pixel connecting semiconductor portion 12, which are described by taking implementable arrangement manners among those arrangement manners as examples.

As an implementable embodiment, with continued reference to FIG. 9 and FIG. 10, the first node N1 and the second node N2 in the pixel driving semiconductor portion 11 are respectively located on two opposite sides of the pixel driving semiconductor portion 11 in the first direction, the first direction is parallel to the column direction or the angle between the first direction and the column direction is an acute angle, and the pixel driving semiconductor portions 11 in the two pixel circuits have the same pattern.

Exemplarily, the first direction is not limited in the embodiments of the present disclosure, and the first direction may be parallel to the column direction Y or the angle between the first direction and the column direction Y is an acute angle. In FIG. 9 and FIG. 10, it is taken as an example for illustration that the first direction is approximately parallel to the column direction Y, that is, the included angle between the first direction and the column direction Y is an acute angle. Further, as shown in FIG. 9 and FIG. 10, patterns of the pixel driving semiconductor portions 11 in any two pixel circuits are the same so that the driving capabilities of any two driving circuits can be the same, thereby ensuring good display uniformity of the display panel. Moreover, patterns of the pixel driving semiconductor portions 11 in any two pixel circuits being the same may further ensure that the pixel driving semiconductor portions 11 can be provided in a simple way and the mask reticle has a simple structure in the mask process. Therefore, in the scheme of the embodiment of the present disclosure, the gate of the drive transistor T3 and the anode of the light-emitting element are reset separately so that the good effect of resetting of both the gate of the drive transistor T3 and the anode of the light-emitting element can be ensured, and multiple pixel driving semiconductor portions 11 can be connected in the row direction by the pixel connecting semiconductor portions 12 to form a continuous semiconductor trace so that the basic consistency of the driving capabilities of the pixel circuits can be ensured, and the display uniformity can be improved on the basis of achieving the display uniformity, and it can be ensured that the pixel driving semiconductor portion 11 can be provided in a simple way and the mask reticle has a simple structure in the mask process.

It is to be noted that, in FIG. 9 and FIG. 10, in pixel driving semiconductor portions 11 at two adjacent stages, the first node N1 and the second node N2 are staggered in the column direction Y. Exemplarily, the second node N2 in the pixel driving semiconductor portion 11 at the previous stage is located at a position above the first node N1 in the pixel driving semiconductor portion 11 at the current stage. This arrangement is only for the sake of a simpler illustration of the pixel connecting semiconductor portion 12 in FIG. 9 and FIG. 10, rather than limiting the scheme of the embodiment. For example, in pixel driving semiconductor portions 11 at two adjacent stages, the first node N1 and the second node N2 may also be staggered in the column direction Y. By adjusting the arrangements of the pixel connecting semiconductor portions 12, it is ensured that the first node N1 in the first pixel driving semiconductor portion 11-1 is electrically connected to the first node N1 in the second pixel driving semiconductor portion 11-2 by the pixel connecting semiconductor portion 12, or in two adjacent pixel driving semiconductor portions 11 arranged in the row direction, the second node N2 in the first pixel driving semiconductor portion 11-1 is electrically connected to the second node N2 in the second pixel driving semiconductor portion 11-2 by the pixel connecting semiconductor portion.

Figure 11:
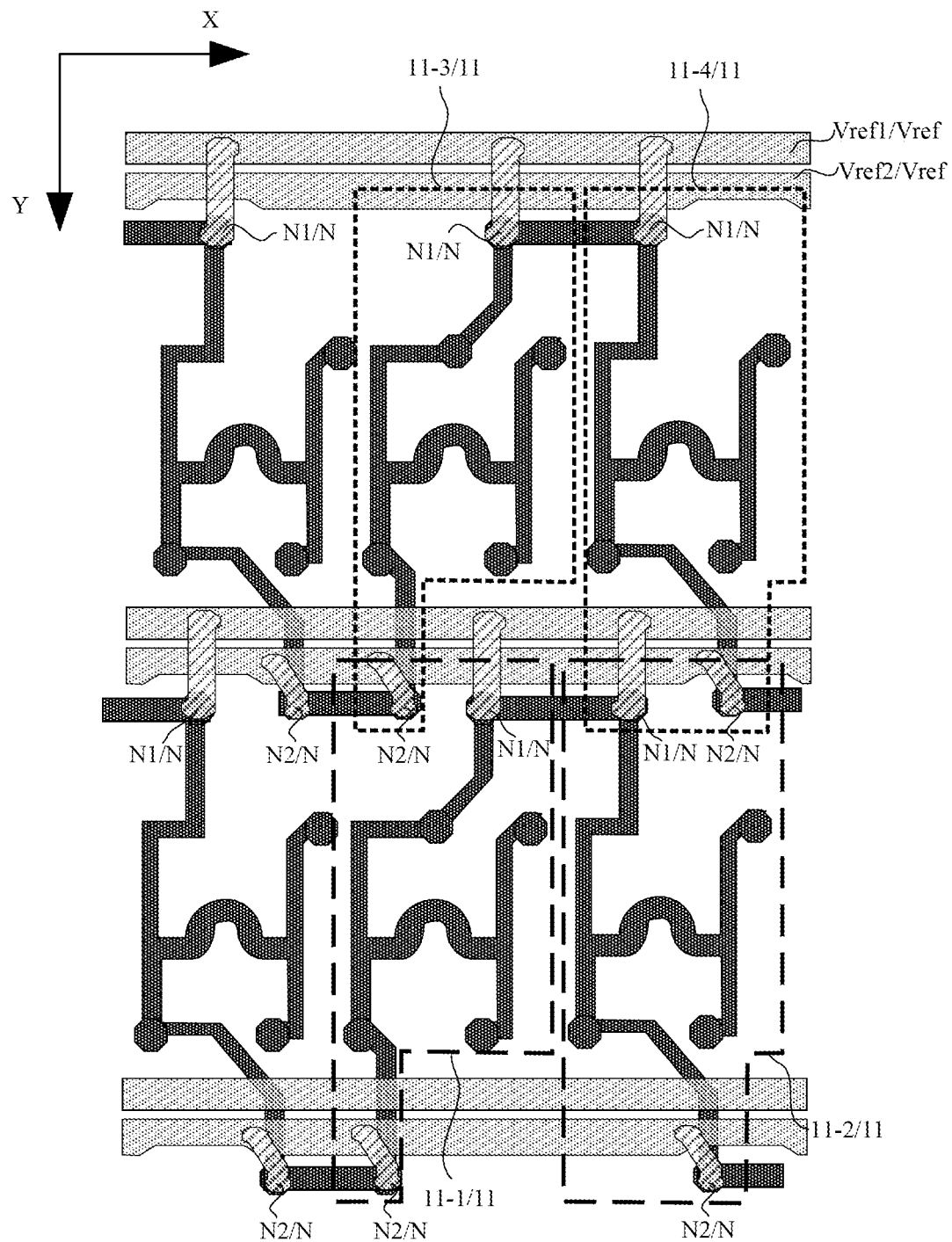
FIG. 11 is a structural diagram of another pixel driving semiconductor portion, pixel connecting semiconductor portion and reference signal line according to an embodiment of the present disclosure.
Figure 12:
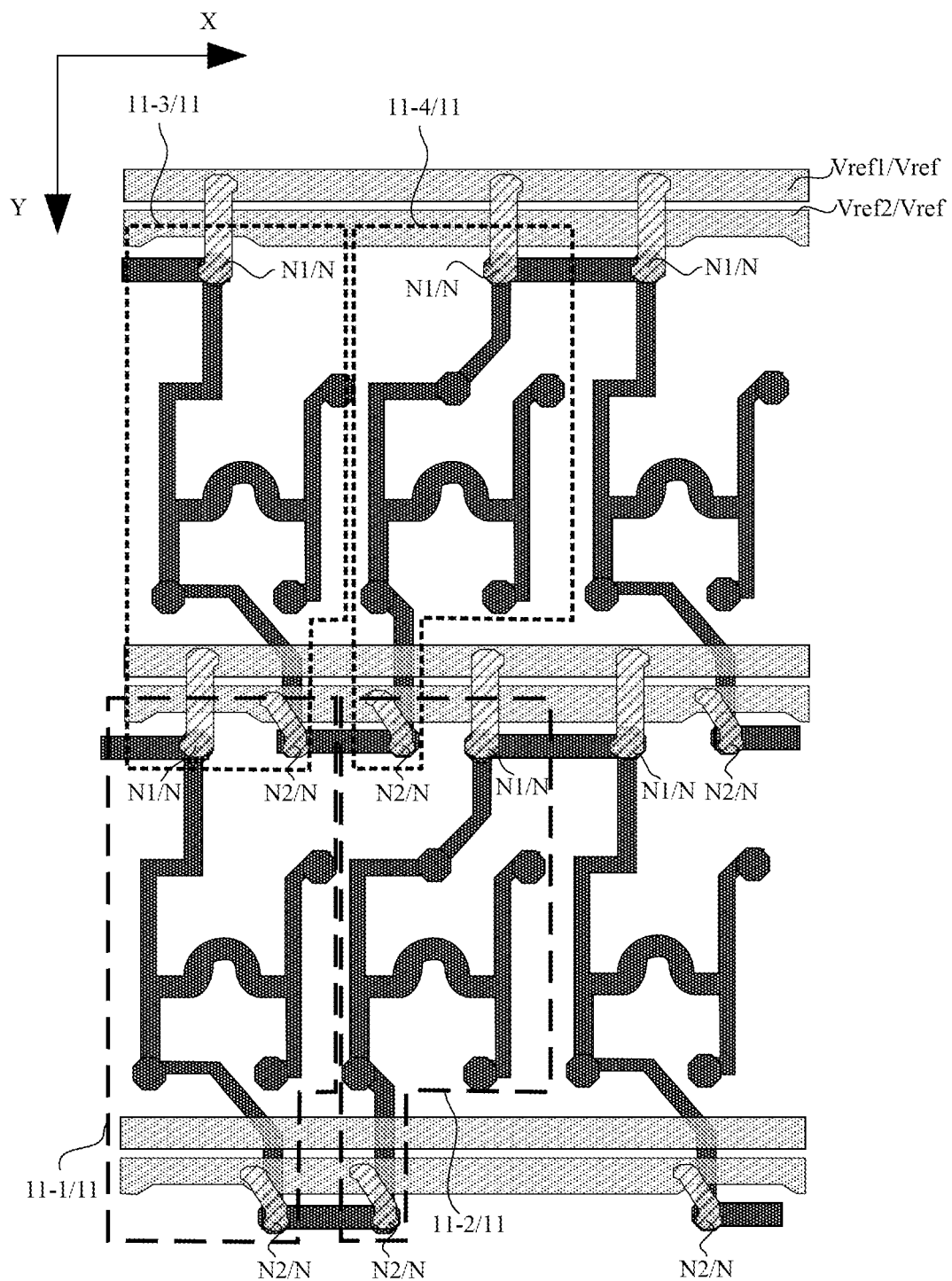
FIG. 12 is a structural diagram of another pixel driving semiconductor portion, pixel connecting semiconductor portion and reference signal line according to an embodiment of the present disclosure.
Figure 13:
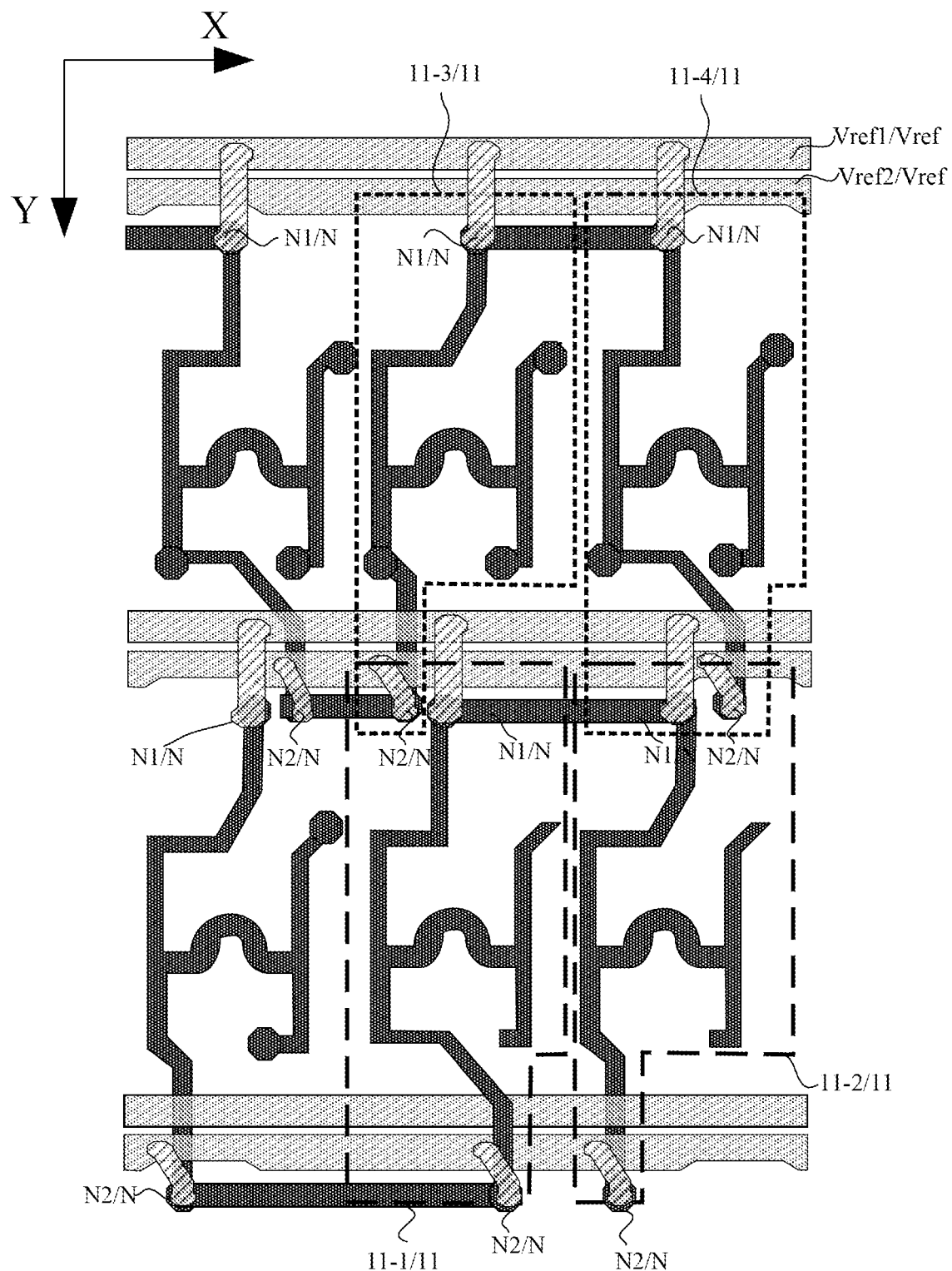
FIG. 13 is a structural diagram of another pixel driving semiconductor portion, pixel connecting semiconductor portion and reference signal line according to an embodiment of the present disclosure.
Figure 14:
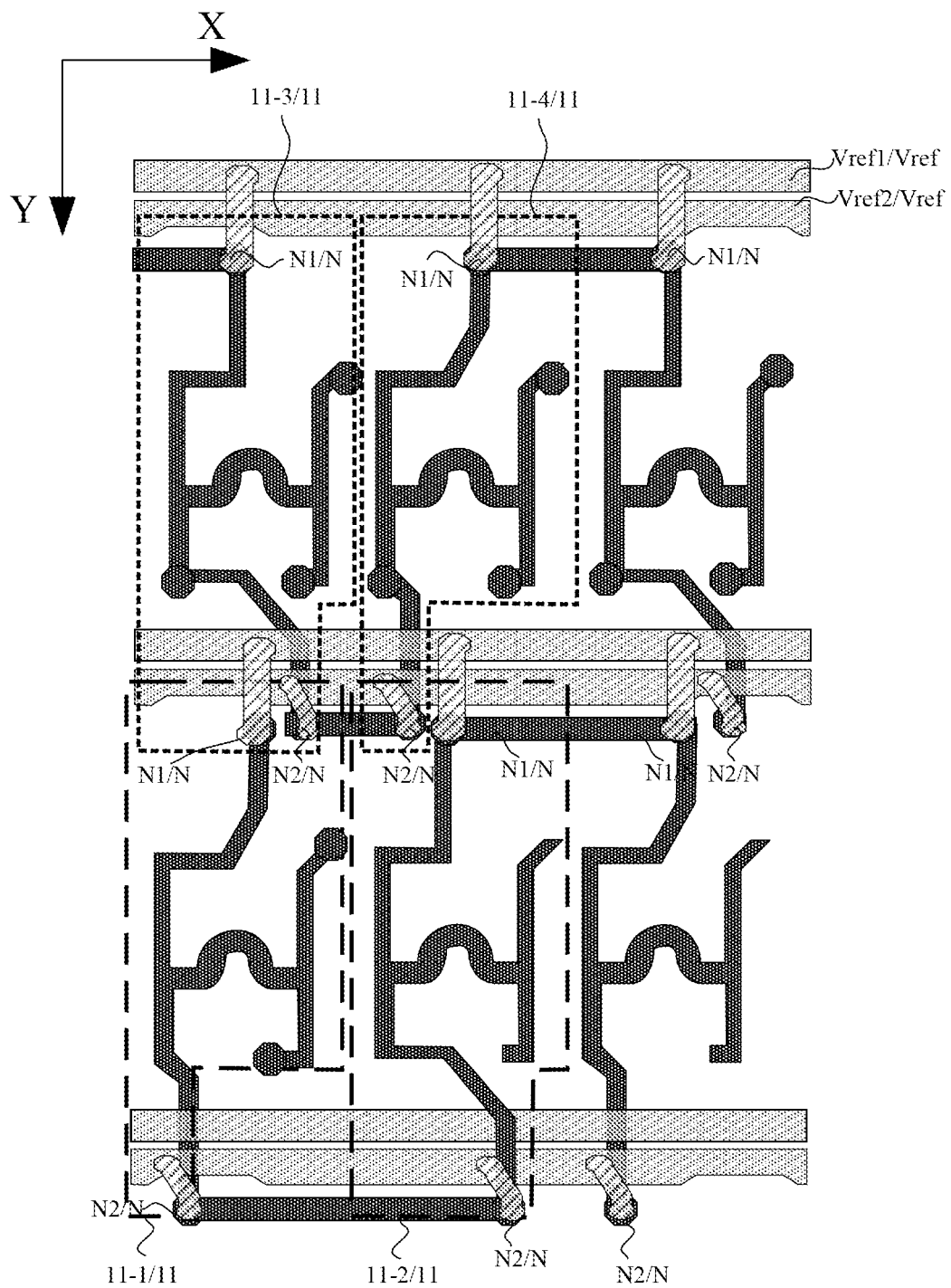
FIG. 14 is a structural diagram of another pixel driving semiconductor portion, pixel connecting semiconductor portion and reference signal line according to an embodiment of the present disclosure.

As another implementable embodiment, FIG. 11 is a structural diagram of another pixel driving semiconductor portion, pixel connecting semiconductor portion and reference signal line according to an embodiment of the present disclosure, FIG. 12 is a structural diagram of another pixel driving semiconductor portion, pixel connecting semiconductor portion and reference signal line according to an embodiment of the present disclosure, FIG. 13 is a structural diagram of another pixel driving semiconductor portion, pixel connecting semiconductor portion and reference signal line according to an embodiment of the present disclosure, and FIG. 14 is a structural diagram of another pixel driving semiconductor portion, pixel connecting semiconductor portion and reference signal line according to an embodiment of the present disclosure. With reference to FIG. 11 to FIG. 14, the first node N1 and the second node N2 in the pixel driving semiconductor portion 11 are respectively located on two opposite sides of the pixel driving semiconductor portion 11 in a second direction, and the second direction is parallel to the plane where the array substrate is located and the second direction is parallel to the column direction or the included angle between the second direction and the column direction is an acute angle. In the row direction, patterns of the pixel driving semiconductor portions 11 in two adjacent pixel circuits arranged sequentially are different, and patterns of two pixel driving semiconductor portions 11 spaced apart by one pixel driving semiconductor portion 11 are the same.

Exemplarily, the second direction is not limited in the embodiments of the present disclosure, and the second direction may be parallel to the row direction X or the included angle between the second direction and the row direction X is an acute direction. In FIG. 11 to FIG. 14, it is taken as an example for illustration that the included angle between the second direction and the row direction X is an acute direction. Further, as shown in FIG. 11 to FIG. 14, the first node N1 and the second node N2 in the pixel driving semiconductor portion 11 are respectively located on two opposite sides of the pixel driving semiconductor portion 11 in the second direction, and thus in pixel driving semiconductor portions 11 at two adjacent stages, the first node N1 in the pixel driving semiconductor portion 11 at the current stage does not overlap with the second node N2 in the pixel driving semiconductor portion 11 at the previous stage. In this way, the first node N1 in the pixel driving semiconductor portion 11 at the current stage and the second node N2 in the pixel driving semiconductor portion 11 at the previous stage can be arranged side by side in the row direction, so that the distance between the pixel driving semiconductor portions 11 at two adjacent stages in the column direction can be reduced, and the compact arrangement of the pixel driving semiconductor portions 11 can be ensured, which facilitates increasing the number of pixel driving semiconductor portions 11 per unit area, that is, the increasing the resolution of the display panel. Thus, the display effect of the display panel is improved. Further, in the row direction, the patterns of the pixel driving semiconductor portions 11 in two adjacent pixel circuits arranged sequentially are different, and the patterns of two pixel driving semiconductor portions 11 spaced apart by one pixel driving semiconductor portion 11 are the same. In this way, the first node N1 and/or the second node N2 in two adjacent pixel driving semiconductor portions 11 in the row direction can be closer to each other, which facilitates reducing the extension length of the pixel connecting semiconductor portion 12, and reducing the area of multiple pixel driving semiconductor portions 11 in the display panel while reducing the loss of signal when being transmitted in the pixel connecting semiconductor portions 12. Moreover, it facilitates improving the resolution of the display panel and improving the display effect. Therefore, in the scheme of the embodiment of the present disclosure, the gate of the drive transistor T3 and the anode of the light-emitting element are set separately so that the good effect of resetting of both the gate of the drive transistor T3 and the anode of the light-emitting element is ensured, and multiple pixel driving semiconductor portions 11 can be connected in the row direction by the pixel connecting semiconductor portions 12 to form a continuous semiconductor trace so that the basic consistency of the driving capabilities of the pixel circuits is ensured, the resolution of the display panel can be improved on the basis of achieving the display uniformity, and the display effect of the display panel can be improved.

Further, in the row direction, the patterns of the pixel driving semiconductor portions 11 in the two adjacent pixel circuits arranged sequentially are different, and the patterns of two pixel driving semiconductor portions 11 spaced apart by one pixel driving semiconductor portion 11 are the same, that is, in any row, the pixel driving semiconductor portions 11 at positions of odd-numbered columns have the same structure, and the pixel driving semiconductor portions 11 at positions of even-numbered columns have the same structure, as shown in FIG. 11 to FIG. 14. Further, on the basis of the above-described embodiment, as shown in FIG. 11 and FIG. 12, in any two rows, the pixel driving semiconductor portions 11 at positions of odd-numbered columns have the same structure, and the pixel driving semiconductor portions 11 at positions of even-numbered columns have the same structure. Alternatively, as shown in FIG. 13 and FIG. 14, in two adjacent rows, the pixel driving semiconductor portions 11 at positions of odd-numbered columns in the first row and the pixel driving semiconductor portions 11 at positions of even-numbered columns in the second row have the same structure and the pixel driving semiconductor portions 11 at positions of even-numbered columns in the first row and the pixel driving semiconductor portions 11 at positions in odd-numbered columns in the second row have the same structure. In the embodiments of the present disclosure, the specific arrangement of the pixel driving semiconductor portions 11 is not limited, as long as it can be ensured that in the row direction, the patterns of the pixel driving semiconductor portions 11 in two adjacent pixel circuits arranged sequentially are different and the patterns of two pixel driving semiconductor portions 11 spaced apart by one pixel driving semiconductor portion 11 are the same, which ensures that the pixel driving semiconductor portions 11 can be arranged in a compact manner, facilitates the improvement of the number of pixel driving semiconductor portions 11 per unit area, that is, the improvement of the resolution of the display panel.

The above embodiments are described hereinafter by taking the first reset transistor being a single gate transistor as an example.

On the basis of the above-described embodiments, with continued reference to FIG. 11 to FIG. 14, any two adjacent pixel driving semiconductor portions 11 arranged sequentially in the row direction X include the first pixel driving semiconductor portion 11-1 and the second pixel driving semiconductor portion 11-2; the pixel driving semiconductor portion 11 located on a first side of the first pixel driving semiconductor portion 11-1 in the column direction Y is a third pixel driving semiconductor portion 11-3, and the pixel driving semiconductor portion 11 located on a first side of the second pixel driving semiconductor portion 11-2 in the column direction Y is a fourth pixel driving semiconductor portion 11-4.

The first node N1 in the first pixel driving semiconductor portion 11-1, the first node N1 in the second pixel driving semiconductor portion 11-2, the second node N2 in the third pixel driving semiconductor portion 11-3 and the second node N2 in the fourth pixel driving semiconductor portion 11-4 are arranged in the row direction X. The first node N1 in the first pixel driving semiconductor portion 11-1 and the first node N1 in the second pixel driving semiconductor portion 11-2 are located between the second node in the third pixel driving semiconductor portion 11-3 and the second node in the fourth pixel driving semiconductor portion 11-4 in the row direction X; or, the second node N2 in the third pixel driving semiconductor portion 11-3 and the second node N2 in the fourth pixel driving semiconductor portion 11-4 are located between the first node N1 in the first pixel driving semiconductor portion 11-1 and the first node N1 in the second pixel driving semiconductor portion 11-2 in the row direction X.

Exemplarily, as shown in FIG. 11 to FIG. 14, it is arranged that the first node N1 and the second node N2 in the pixel driving semiconductor portion 11 are respectively located on two opposite sides of the pixel driving semiconductor portion 11 in the second direction, and in the row direction, the patterns of the pixel driving semiconductor portions 11 in two adjacent pixel circuits arranged sequentially are different, and the patterns of two pixel driving semiconductor portions 11 spaced apart by one pixel driving semiconductor portion 11 are the same. Therefore, it can be ensured that the first node N1 in the first pixel driving semiconductor portion 11-1, the first node N1 in the second pixel driving semiconductor portion 11-2, the second node N2 in the third pixel driving semiconductor portion 11-3 and the second node N2 in the fourth pixel driving semiconductor portion 11-4 are arranged in the row direction X, that is, located at the same height in the horizontal direction. In this way, the pixel driving semiconductor portions 11 can be arranged in a compact manner, which facilitates the increase of the number of pixel driving semiconductor portions 11 per unit area, that is, the improvement of the resolution of the display panel. Specifically, in FIG. 11 and FIG. 13, it is taken as an example for illustration that the first node N1 in the first pixel driving semiconductor portion 11-1 and the first node N1 in the second pixel driving semiconductor portion 11-2 are located between the second node in the third pixel driving semiconductor portion 11-3 and the second node in the fourth pixel driving semiconductor portion 11-4 in the row direction X; and in FIG. 12 and FIG. 14, it is taken as an example for illustration that the second node N2 in the third pixel driving semiconductor portion 11-3 and the second node N2 in the fourth pixel driving semiconductor portion 11-4 are located between the first node N1 in the first pixel driving semiconductor portion 11-1 and the first node N1 in the second pixel driving semiconductor portion 11-2 in the row direction X.

In the embodiments described above, taking the first reset transistor being a single-gate transistor as an example, it is described in detail that by reasonably arranging the pixel driving semiconductor portions 11, it can be ensured that the pixel driving semiconductor portions are arranged in a compact manner, which facilitates the increase of the number of pixel driving semiconductor portions 11 per unit area, that is, the improvement of the resolution of the display panel, and the improvement of the display effect of the display panel.

Next, it is taken as an example for illustration that the first reset transistor is a dual-gate transistor.

Figure 15:
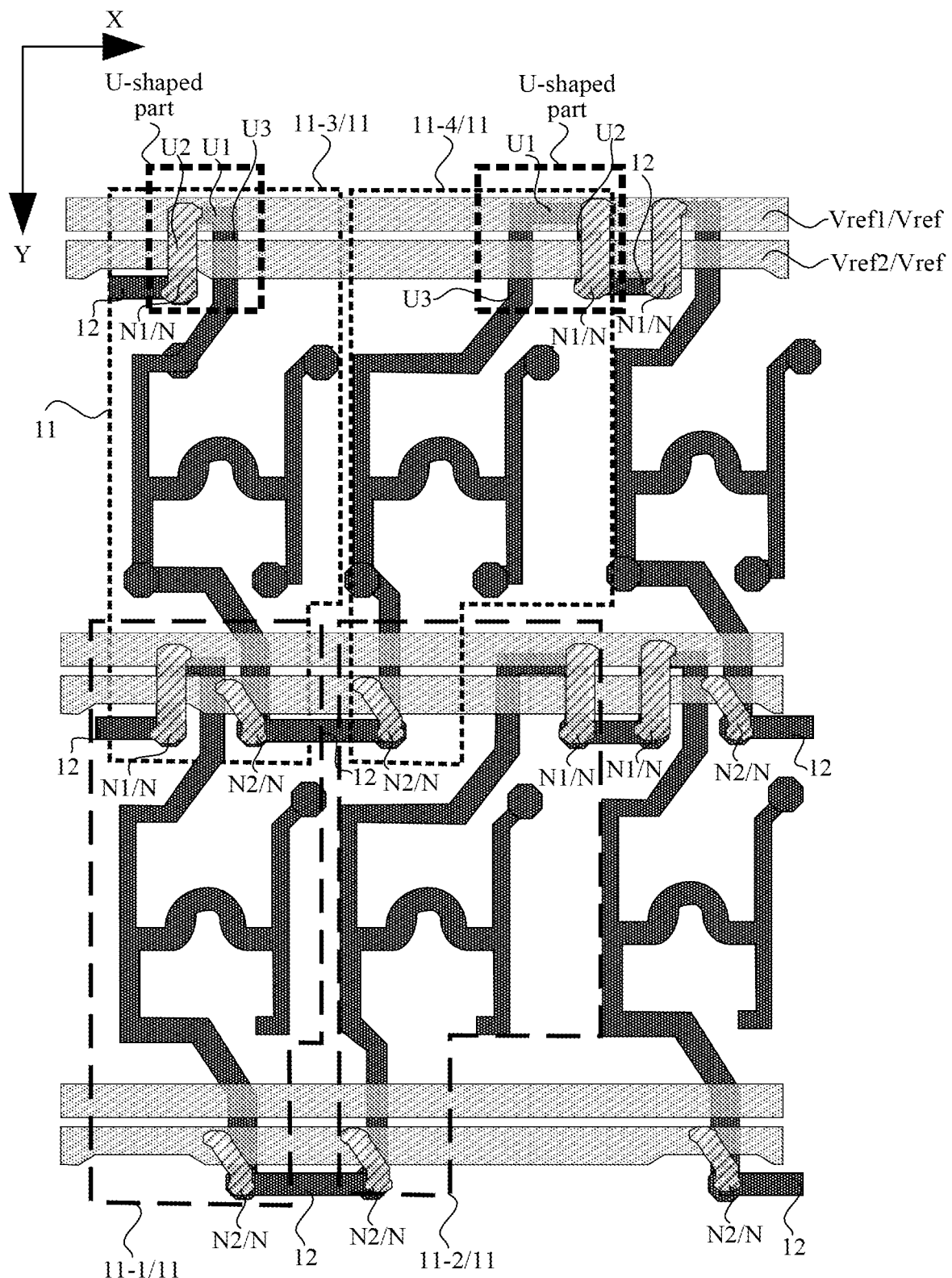
FIG. 15 is a structural diagram of another pixel driving semiconductor portion, pixel connecting semiconductor portion and reference signal line according to an embodiment of the present disclosure.
Figure 16:
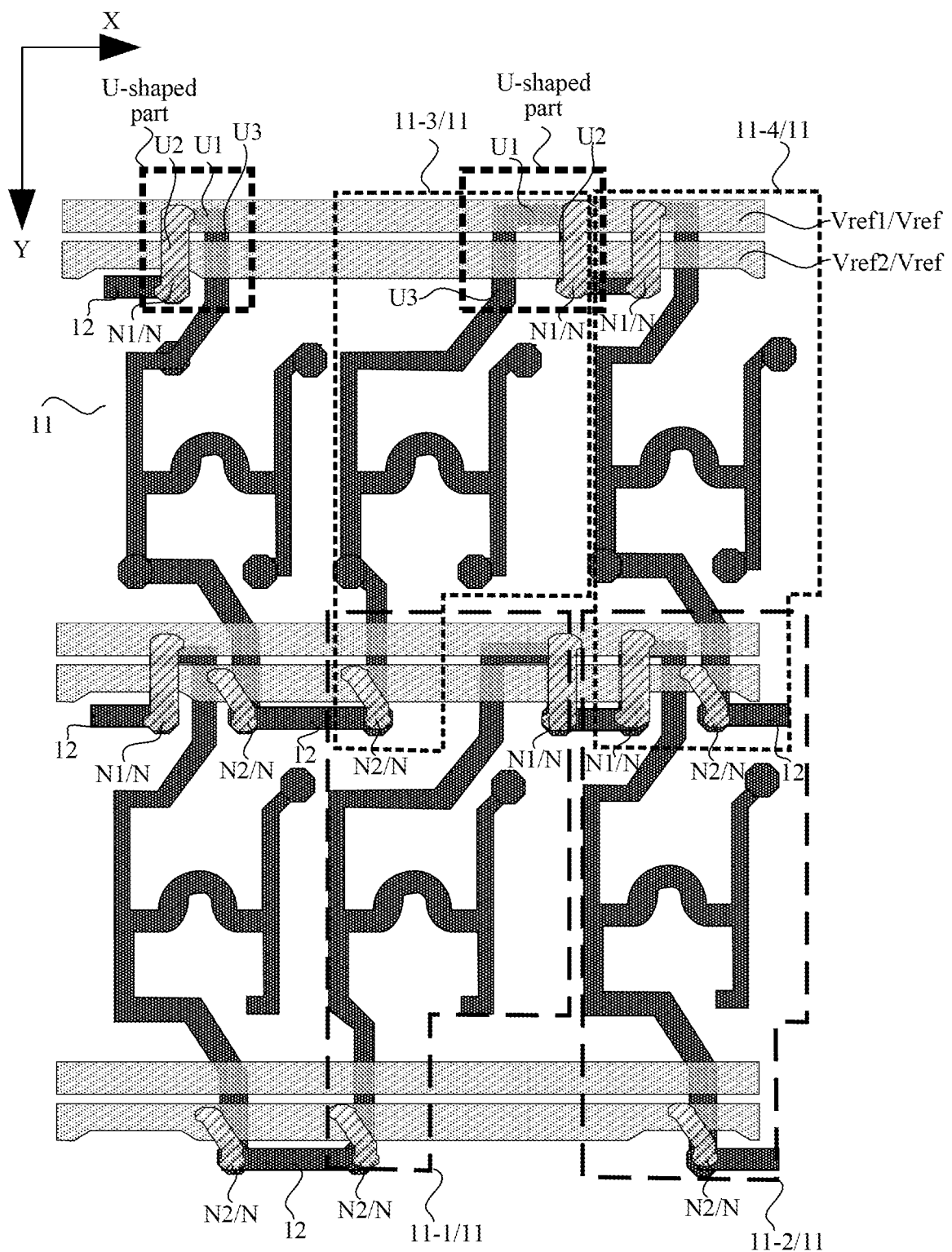
FIG. 16 is a structural diagram of another pixel driving semiconductor portion, pixel connecting semiconductor portion and reference signal line according to an embodiment of the present disclosure.

FIG. 15 is a structural diagram of another pixel driving semiconductor portion, pixel connecting semiconductor portion and reference signal line according to an embodiment of the present disclosure, and FIG. 16 is a structural diagram of another pixel driving semiconductor portion, pixel connecting semiconductor portion and reference signal line according to an embodiment of the present disclosure. Referring to FIG. 15 and FIG. 16, the pixel driving semiconductor portion 11 includes a U-shaped part, the U-shaped part includes a connecting part U1 a first branch part U2 and a second branch part U3, the first branch part U2 and a second branch part U3 are respectively connected to two ends of the connecting portion U1, and the first branch part U2 and the second branch part U3 are arranged in the row direction X and extend in the column direction. One terminal of the first branch part U2 away from the connecting portion U1 is the first node N1.

In the row direction X, the first branch parts U2 in the first pixel driving semiconductor portion 11-1 and the second pixel driving semiconductor portion 11-2 are located on sides of the second branch parts U3 in the first pixel driving semiconductor portion 11-1 and the second pixel driving semiconductor portion 11-2 away from the second nodes N2 in the third pixel driving semiconductor portion 11-3 and the fourth pixel driving semiconductor portion 11-4. Alternatively, in the row direction X, the second nodes N2 in the third pixel driving semiconductor portion 11-3 and the fourth pixel driving semiconductor portion 11-4 are located on the sides of the second branch parts U3 in the first pixel driving semiconductor portion 11-1 and the second pixel driving semiconductor portion 11-2 away from the first nodes N1 in the first pixel driving semiconductor portion 11-1 and the second pixel driving semiconductor portion 11-2.

Exemplarily, as shown in FIG. 15 and FIG. 16, the pixel driving semiconductor portion 11 includes the U-shaped part; in a direction perpendicular to the plane where the substrate is located, there are two overlapping regions between the first scanning line Scant and the U-shaped part; and the two overlapping regions correspondingly form channel regions of a dual-gate transistor, that is, the first reset transistor is a dual-gate transistor, which ensures a small leakage current of the first reset transistor and a stable gate potential of the drive transistor. Further, the U-shaped part includes the connecting portion U1, the first branch part U2 and the second branch part U3, and the first branch part U2 and the second branch part U3 are respectively connected to two ends of the connecting portion U1. The first branch part U2 and the second branch part U3 are arranged in the row direction X and extend in the column direction, one terminal of the first branch part U2 away from the connecting portion U1 is the first node N1, and the first branch part U2 and the second branch part U3 are disposed in different manners for the pixel driving semiconductor portions 11 at different positions. Specifically, as shown in FIG. 15, in the row direction X, the first branch parts U2 in the first pixel driving semiconductor portion 11-1 and the second pixel driving semiconductor portion 11-2 are located on the sides of the second branch parts U3 in the first pixel driving semiconductor portion 11-1 and the second pixel driving semiconductor portion 11-2 away from the second nodes N2 in the third pixel driving semiconductor portion 11-3 and the fourth pixel driving semiconductor portion 11-4, that is, the nodes N2 in the third pixel driving semiconductor portion 11-3 and the fourth pixel driving semiconductor portion 11-4 are closer to each other, and the nodes N2 in the third pixel driving semiconductor portion 11-3 and the fourth pixel driving semiconductor portion 11-4 in the same row and adjacent to each other are connected by the pixel connecting semiconductor portion 12, which ensures that the pixel connecting semiconductor portion 12 is provided in a simple manner and the extension length of the pixel connecting semiconductor portion 12 in the row direction X is short. Therefore, it can be ensured that the transmission loss of the signal on the pixel connecting semiconductor portion 12 is small and the display effect of the display panel is good. As shown in FIG. 16, in the row direction X, the first branch parts U2 in the first pixel driving semiconductor portion 11-1 and the second pixel driving semiconductor portion 11-2 are located on the sides of the second branch parts U3 in the first pixel driving semiconductor portion 11-1 and the second pixel driving semiconductor portion 11-2 away from the second nodes N2 in the third pixel driving semiconductor portion 11-3 and the fourth pixel driving semiconductor portion 11-4, that is, the first branch parts U2 in the first pixel driving semiconductor portion 11-1 and the second pixel driving semiconductor portion 11-2 are closer to each other, and the first branch parts U2 in the first pixel driving semiconductor portion 11-1 and the second pixel driving semiconductor portion 11-2 in the same row and adjacent to each other are connected by the pixel connecting semiconductor portion 12. That is, the nodes N1 in the first pixel driving semiconductor portion 11-1 and the second pixel driving semiconductor portion 11-2 in the same row and adjacent to each other are connected by the pixel connecting semiconductor portion 12, which ensures that the pixel connecting semiconductor portion 12 is provided in a simple manner and the extension length of the pixel connecting semiconductor portion 12 in the row direction X is short. Therefore, it can be ensured that the transmission loss of the signal on the pixel connecting semiconductor portion 12 is small and the display effect of the display panel is good.

In summary, the above-described embodiment describes multiple manners of arranging the pixel connecting semiconductors, and by arranging the pixel connecting semiconductor portion as a part of the pixel driving semiconductor portion, it is ensured that the pixel connecting semiconductor portion can be arranged in a simple way. Alternatively, by arranging the pixel connecting semiconductor portion to connect multiple pixel driving semiconductor portions in the column direction or row direction to form a continuous semiconductor trace, it is ensured that static electricity can be uniformly distributed on the continuous semiconductor trace, and further, the reliability and uniformity of the performance of the pixel driving semiconductor portions 11 in the subsequent high-temperature fabrication process can be improved. Therefore, the driving capabilities of the pixel circuits can be substantially consistent, the display uniformity can be achieved, and the display effect can be improved. Further, in the case where multiple pixel driving semiconductor portions in the row direction form a continuous semiconductor trace by the pixel connecting semiconductor portions, it is ensured that the pixel connecting semiconductor portion can be arranged in a simple manner or multiple pixel driving semiconductor portions can be arranged into a compact structure by reasonably setting the positional relationship between the first node and the second node in the pixel driving semiconductor portion, which facilitates the improvement of the number of the pixel driving semiconductor portions per unit area, that is, the improvement of the resolution of the display panel, and the improvement of the display effect of the display panel.

Figure 17:
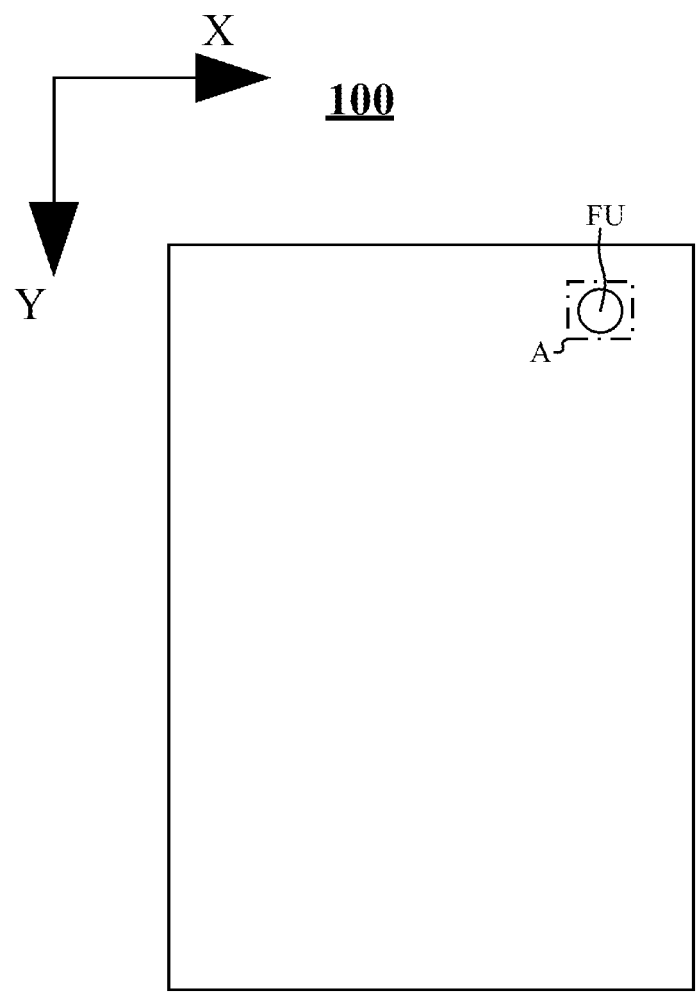
FIG. 17 is a structural diagram of another display panel according to an embodiment of the present disclosure.
Figure 18:
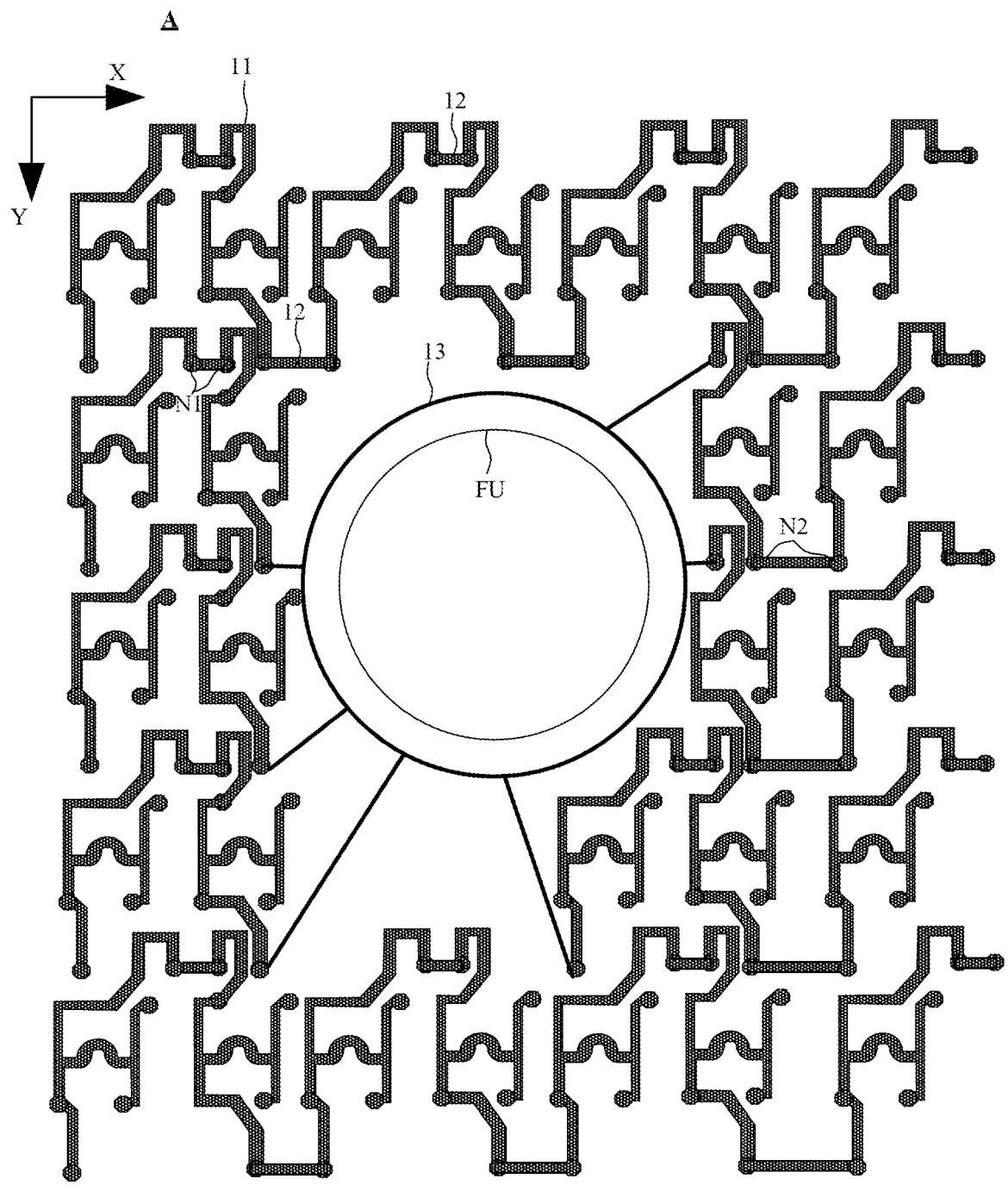
FIG. 18 is an enlarged exemplary view of a region A in FIG. 17.

On the basis of the above-described embodiment, FIG. 17 is a structural diagram of another display panel according to an embodiment of the present disclosure, and FIG. 18 is an enlarged exemplary view of a region A in FIG. 17. As shown in FIG. 17 and FIG. 18, the array substrate 100 may include a functional region FU, and pixel circuits 10 are arranged on two sides of the functional region FU in the row direction (the direction X as shown in FIGS. 17 and 18) or the column direction (the direction Y as shown in FIGS. 17 and 18).

The array substrate 100 further includes a region connecting semiconductor portion 13.

The region connecting semiconductor portion 13 extends around the functional region FU. The fixed potential nodes in the pixel driving semiconductor portions 11 located on two sides of the functional region FU in the row direction or the column direction are connected to the region connecting semiconductor portion 13.

Exemplarily, the array substrate 100 has the functional region FU, and functional devices such as a camera, a handset or an optical fingerprint sensor may be disposed at the position corresponding to the functional region FU. The shape of the functional region FU may be circular, rectangular, rounded rectangular, or the like, which is not limited in the present application. One or more functional regions FU may be provided, which is not limited in the present application. The functional region FU may be a non-display region or a display region. In the case where the functional region FU is the display region, it can be understood that the functional region FU also has corresponding pixel circuits. In order to improve the light transmission of the functional region FU, the pixel circuit corresponding to the functional region FU may be disposed in a region other than the functional region FU, for example, the pixel circuits 10 are arranged on two sides of the functional region FU in the column direction Y.

Further, as shown in FIG. 18, fixed potential nodes in the pixel driving semiconductor portions 11 located on two sides of the functional region FU in the row direction or the column direction are connected to the region connecting semiconductor portion 13. The fixed potential nodes in the pixel driving semiconductor portions 11 located on the two sides of the functional region FU are connected by the region connecting semiconductor portion 13, so that the pixel driving semiconductor portions 11 located on the two sides of the functional region FU in the row direction or the column direction are no longer separate, and the pixel driving semiconductor portions 11 located on the two sides of the functional region FU in the row direction or the column direction and the region connecting semiconductor portion 13 can be understood as also constituting a continuous semiconductor trace. Therefore, static electricity can be uniformly distributed on the continuous semiconductor trace corresponding to the functional region FU, and further, the reliability and uniformity of the performance of the pixel driving semiconductor portions 11 on the two sides of the functional region FU in the row direction or the column direction in the subsequent high-temperature fabrication process can be improved, the driving capabilities of the pixel circuits can be substantially consistent, the display uniformity can be achieved, and the display effect can be improved.

It is to be noted that, in FIG. 18, the pixel driving semiconductor portions 11 located on the two sides of the functional region FU in the row direction being connected to the region connecting semiconductor portion 13 is taken as an example for illustration, and the pixel driving semiconductor portions 11 located on the two sides of the functional region FU in the column direction are connected to the region connecting semiconductor portion 13 in the same manner as the above-described manner, which is not repeatedly described here. In each of the subsequent embodiments, the pixel driving semiconductor portions 11 located on the two sides of the functional region FU in the row direction being connected is taken as an example for illustration, and the connection of the pixel driving semiconductor portions in the column direction are the same as the connection of the pixel driving semiconductor portions in the row direction, which is not repeatedly described subsequently.

It is further to be noted that, in FIG. 18, only one structure of the pixel driving semiconductor portion 11 is taken as an example for illustration, and the connection relationship between the region connecting semiconductor portion 13 and the remaining structures of the pixel driving semiconductor portion 11 is the same as the above-described connection relationship, which is not repeatedly described here.

Figure 19:
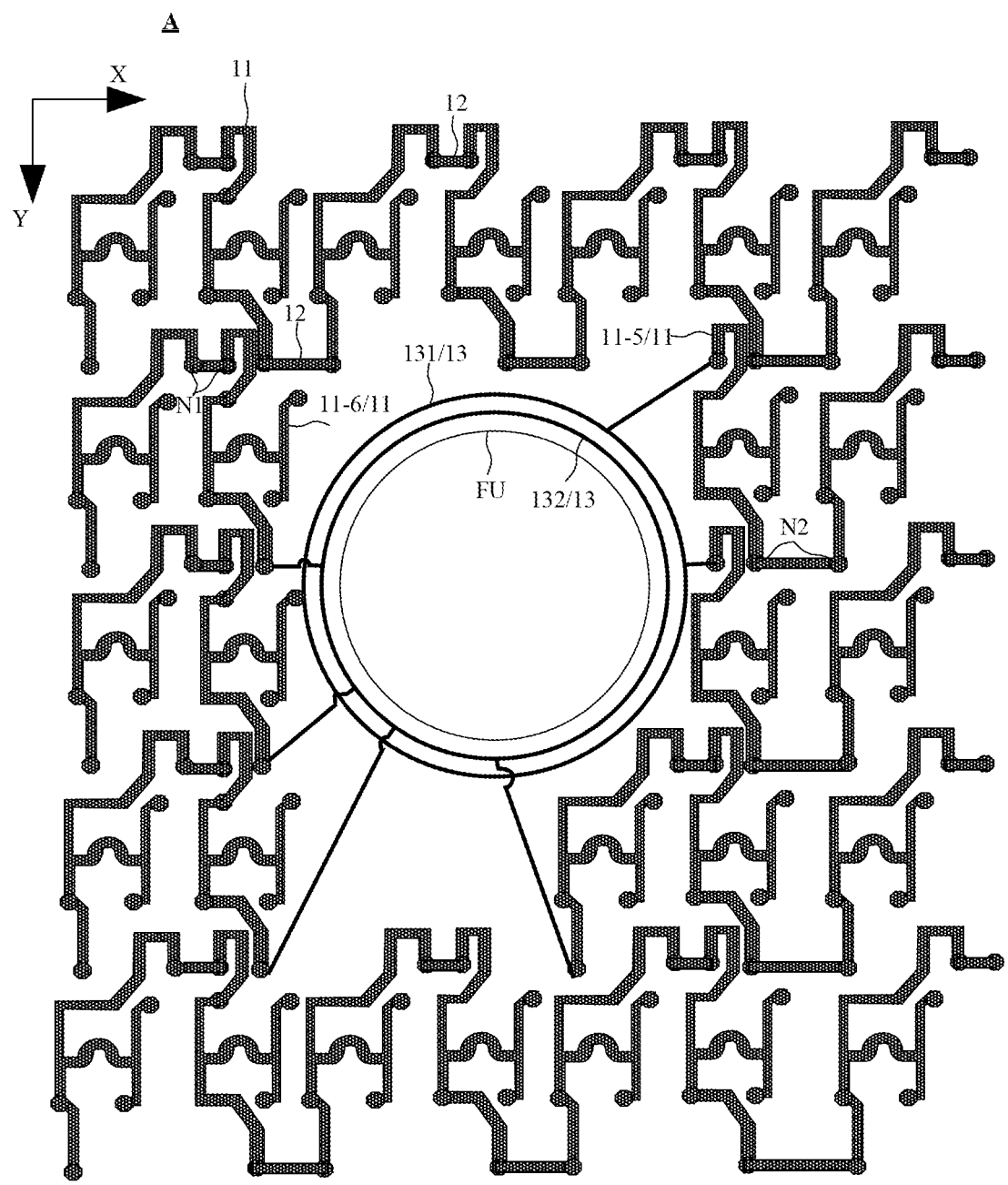
FIG. 19 is another enlarged exemplary view of the region A in FIG. 17.

On the basis of the above embodiments, FIG. 19 is another enlarged example diagram of the region A in FIG. 17. As shown in FIG. 19, the reference signal line includes the first reference signal line and the second reference signal line that extend in the row direction and are parallel to each other, and two fixed potential nodes include the first node and the second node. In the same pixel driving semiconductor portion, the first node is electrically connected to the first reference signal line, and the second node is electrically connected to the second reference signal line. The region connecting semiconductor portion 13 includes a first region connecting semiconductor portion 131 and a second region connecting semiconductor portion 132, and the pixel driving semiconductor portion 11 adjacent to the functional region FU includes a fifth pixel driving semiconductor portion 11-5 and a sixth pixel driving semiconductor portion 11-6. In the row direction X or the column direction Y, the second node N2 in the pixel driving semiconductor portion 11 located on the side of the fifth pixel driving semiconductor portion 11-5 away from the functional region FU is connected to the second node N2 in the fifth pixel driving semiconductor portion 11-5 by the pixel connecting semiconductor portion 12. In the row direction X or the column direction Y, the first node N1 in the pixel driving semiconductor portion 11 located on the side of the sixth pixel driving semiconductor portion 11-6 away from the functional region FU is connected to the first node N1 in the sixth pixel driving semiconductor portion 11-6 by the pixel connecting semiconductor portion 12. In the row direction X or the column direction Y, the first nodes N1 in at least two fifth pixel driving semiconductor portions 11-5 located on two sides of the functional region FU are connected by the first region connecting semiconductor portion 131. In the row direction X or the column direction Y, the second nodes N2 in at least two sixth pixel driving semiconductor portions 11-6 located on two sides of the functional region FU are connected by the second region connecting semiconductor portion 132.

Exemplarily, the reference signal line is not shown in FIG. 19, and for details of the scheme in which the reference signal line includes the first reference signal line and the second reference signal line, reference may be made to FIG. 2, FIG. 6, and FIG. 9 to FIG. 16, which are not repeatedly described here. By providing two reference signal lines, independent reference signals can be provided for the first node N1 and the second node N2 to ensure independent resetting of the gate of the drive transistor and the anode of the light-emitting element, thereby ensuring good resetting effect.

Further, in the row direction X or the column direction Y, the second node N2 in the pixel driving semiconductor portion 11 located on the side of the fifth pixel driving semiconductor portion 11-5 away from the functional region FU is connected to the second node N2 in the fifth pixel driving semiconductor portion 11-5 by the pixel connecting semiconductor portion 12, and the first node N1 in the pixel driving semiconductor portion 11 located on the side of the sixth pixel driving semiconductor portion 11-6 away from the functional region FU is connected to the first node N1 in the sixth pixel driving semiconductor portion 11-6 by the pixel connecting semiconductor portion 12, so that static electricity can be uniformly distributed on the continuous semiconductor trace corresponding to the two sides of the functional region FU, and further, the reliability and uniformity of the performance of the pixel driving semiconductor portions 11 on the two sides of the functional region FU in the row direction or the column direction in the subsequent high-temperature fabrication process can be improved. Therefore, the driving capabilities of the pixel circuits can be substantially consistent, the display uniformity can be achieved, and the display effect can be improved.

Further, among the pixel driving semiconductor portions 11 located on two sides of the functional region FU, at least the first nodes N1 in the fifth pixel driving semiconductor portions 11-5 are connected by the first region connecting semiconductor portion 131, and the first region connecting semiconductor portion 131 may transmit the first reference signal Vref to ensure to provide a reset signal for the first nodes N1 in the fifth pixel driving semiconductor portions 11-5 connected to the first region connecting semiconductor portion 131, thereby resetting the gates of the drive transistors in the fifth pixel driving semiconductor portions 11-5. Among the pixel driving semiconductor portions 11 located on two sides of the functional region FU, at least the second nodes N2 in the sixth pixel driving semiconductor portions 11-6 are connected by the second region connecting semiconductor portion 132, and the second region connecting semiconductor portion 132 may transmit the second reference signal Vref to ensure to provide a reset signal for the second nodes N2 in the sixth pixel driving semiconductor portions 11-6 connected to the second region connecting semiconductor portion 132, thereby resetting the anodes of the light-emitting elements corresponding to the sixth pixel driving semiconductor portions 11-6. In summary, the region connecting semiconductor portion 13 includes the first region connecting semiconductor portion 131 and the second region connecting semiconductor portion 132, and the first region connecting semiconductor portion 131 and the second region connecting semiconductor portion 132 can transmit different reference signals, thereby ensuring that the first nodes N1 and the second nodes N2 located on two sides of the functional region FU receive different signals separately, and ensuring that the pixel driving semiconductor portions 11 located on two sides of the functional region FU can provide different reset signals to the gates of the drive transistors and the anodes of the light-emitting elements corresponding to them, thereby ensuring the good reset effect.

Figure 20:
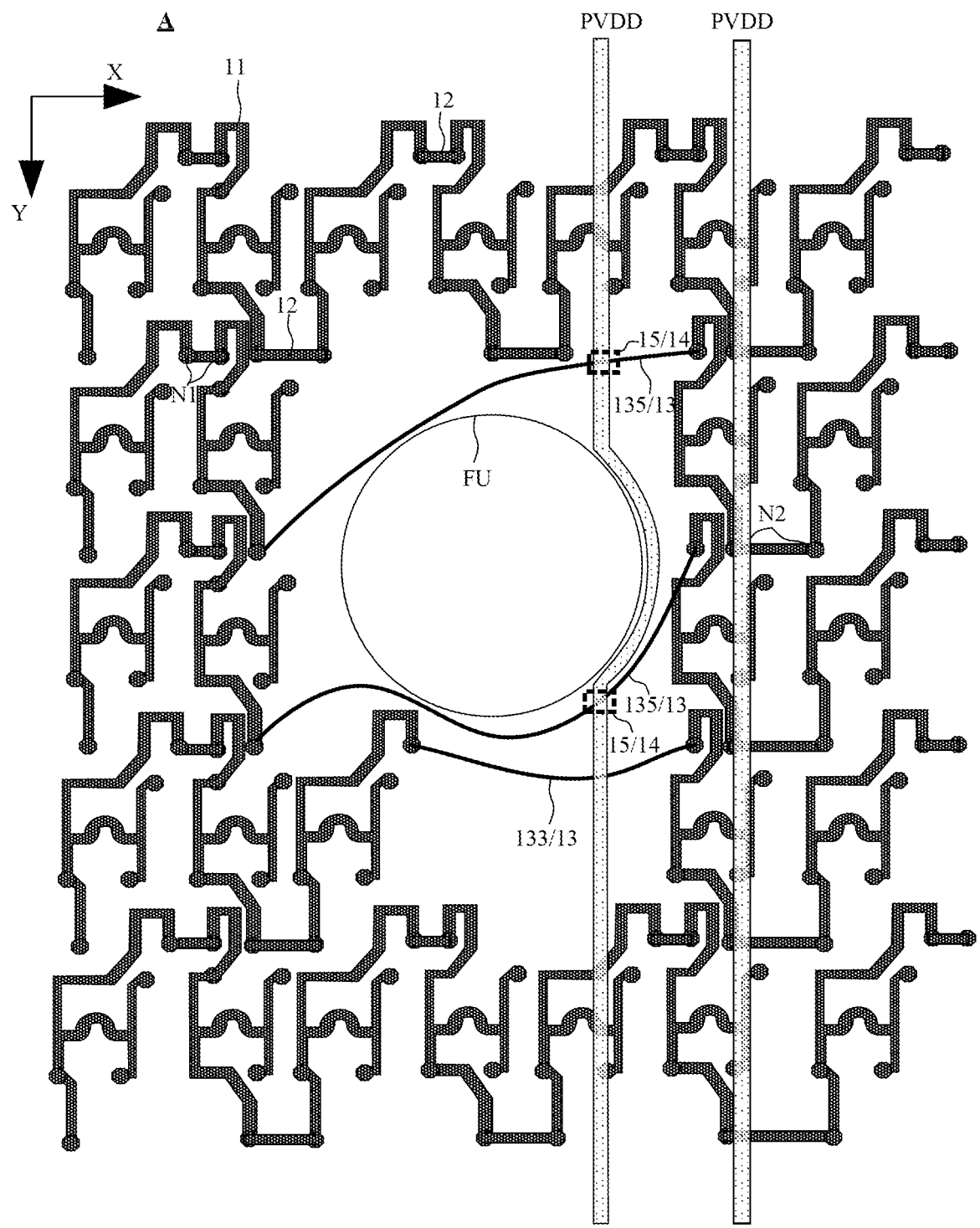
FIG. 20 is another enlarged exemplary view of the region A in FIG. 17.

On the basis of the above-described embodiment, FIG. 20 is another enlarged exemplary view of the region A in FIG. 17. As shown in FIG. 20, the region connecting semiconductor portion 13 includes a third region connecting semiconductor portion 133, and two first nodes N1 in pixel driving semiconductor portions 11 arranged in the row direction or the column direction and respectively located on two sides of the functional region FU are connected by the third region connecting semiconductor portion 133; and/or, the region connecting semiconductor portion 13 includes a fourth region connecting semiconductor portion, and two second nodes N2 in pixel driving semiconductor portions 11 arranged in the row direction or the column direction and respectively located on two sides of the functional region FU are connected by the fourth region connecting semiconductor portion; and/or, the region connecting semiconductor portion 13 includes a fifth region connecting semiconductor portion 135, and the first node N1 and the second node N2 in two pixel driving semiconductor portions 11 arranged in the row direction or the column direction and respectively located on two sides of the functional region FU are connected by the fifth region connecting semiconductor portion 135.

Exemplarily, only the third region connecting semiconductor portion 133 and the fifth region connecting semiconductor portion 135 are shown exemplarily in FIG. 20, and the fourth region connecting semiconductor portion is not shown in FIG. 20. The fourth region connecting semiconductor portion is configured to connect two second nodes N2 in pixel driving semiconductor portions 11 arranged in the row direction or the column direction and located on two sides of the functional region FU respectively, and the manner of connecting the fourth region connecting semiconductor portion to the second nodes N2 may refer to the manner of connecting the third region connecting semiconductor portion 133 to the first node N1, which is not repeatedly described here.

Specifically, the third region connecting semiconductor portion 133 is configured to connect two first nodes N1 in the pixel driving semiconductor portions 11 respectively located on two sides of the functional region FU in the row direction, the fourth region connecting semiconductor portion is configured to connect two second nodes N2 in the pixel driving semiconductor portions 11 respectively located on two sides of the functional region FU in the row direction, and the fifth region connecting semiconductor portion 135 is configured to connect the first node N1 and the second node N2 in the pixel driving semiconductor portions 11 respectively located on two sides of the functional region FU in the row direction, to ensure that two pixel driving semiconductor portions 11 respectively located on two sides of the functional region FU in the row direction are connected to form a continuous semiconductor trace, so that static electricity can be uniformly distributed on the continuous semiconductor trace corresponding to the two sides of the functional region FU, and further, the reliability and uniformity of the performance of the pixel driving semiconductor portions 11 on the two sides of the functional region FU in the row direction in the subsequent high-temperature fabrication process can be improved. Therefore, the driving capabilities of the pixel circuits can be substantially consistent, the display uniformity can be achieved, and the display effect can be improved.

Further, the first reference signal Vref may be transmitted over the third region connecting semiconductor portion 133 to ensure to provide a reset signal for the first nodes N1 in the pixel driving semiconductor portions 11 connected to the third region connecting semiconductor portion 133, thereby resetting the gates of the drive transistors in the pixel driving semiconductor portions 11. The second reference signal Vref may be transmitted over the fourth region connecting semiconductor portion to ensure to provide a reset signal for the second nodes N2 in the pixel driving semiconductor portions 11 connected to the fourth region connecting semiconductor portion, thereby resetting the anodes of the light-emitting elements corresponding to the pixel driving semiconductor portions 11, and ensuring the normal operation of the display circuits and the light-emitting elements connected to the pixel circuits.

With reference to FIG. 18, FIG. 19, and FIG. 20, for the case where the functional region is provided and the functional region blocks the connection relationship of the pixel driving semiconductor portions, the region connecting semiconductor portion may be provided to achieve the connection of the pixel driving semiconductor portions located on the two sides of the functional region in the row direction or the column direction. The region connecting semiconductor portion may be further divided into multiple cases, such as the first region connecting semiconductor portion, the second region connecting semiconductor portion, the third region connecting semiconductor portion, the fourth region connecting semiconductor portion, and the fifth region connecting semiconductor portion, depending on different connection cases, and reference may be made to the above description for the details. The region connecting semiconductor portion according to the embodiment of the present disclosure can be formed in the same film layer, made of the same material and fabricated in the same process as the pixel driving semiconductor portion, which ensures that the region connecting semiconductor portion can be easily arranged, and the display panel can be easily fabricated.

On the basis of the above-mentioned embodiments, with continued reference to FIG. 20, the region connecting semiconductor portion 13 includes the fifth region connecting semiconductor portion 135, and the array substrate 100 further includes a control portion 14. The control portion 14 at least partially overlap with and the fifth region connecting semiconductor portion 135 in the direction perpendicular to the plane where the array substrate is located, and the control portion 14 and the fifth region connecting semiconductor portion 135 constitute a switching element.

Exemplarily, since the fifth region connecting semiconductor portion 135 is configured to connect the first node N1 and the second node N2 in the pixel driving semiconductor portions 11 respectively located on two sides of the functional region FU in the row direction; however, since the reference signals required for the first node N1 and the second node N2 are different, the control portion 14 may be provided and the control portion 14 and the fifth region connecting semiconductor portion 135 constitute a switching element. Further, the switching element is controlled to turn off to control the open circuit between the first node N1 and the second node N2, to prevent the first node N1 and the second node N2 from being provided with the same reference signal transmitted through the fifth region connecting semiconductor portion 135, thereby avoiding the issue that the accuracy of resetting the gate of the drive transistor or the anode of the light-emitting element is not high.

Further, the switching element is provided such that the control portion 14 and the fifth region connecting semiconductor portion 135 at least partially overlap in the direction perpendicular to the plane where the array substrate is located. In this way, the control portion 14 and the fifth region connecting semiconductor portion 135 form a thin-film transistor, and a region where the control portion 14 and the fifth region connecting semiconductor portion 135 overlap serves as a conduction channel of the thin-film transistor. The conduction channel is controlled by the control portion 14 to be cut off to achieve the turning off of the switching element, and further to control the open circuit between the first node N1 and the second node N2 to be broken.

On the basis of the above-described embodiment, the control portion 14 may be further configured to be electrically connected to a fixed voltage terminal, and in this way, a fixed voltage signal may be transmitted in the control portion 14, and the fixed voltage signal may be used as a control signal for controlling the switching element to be turned off, so as to control the switching element to be kept in an off state.

For example, when the thin-film transistor formed by the control portion 14 and the fifth region connecting semiconductor portion 135 is a P-type thin-film transistor, the fixed voltage terminal may be controlled to transmit a high-level signal, and the high-level signal can control the P-type thin-film transistor to be in an off state. For another example, in the case where the thin-film transistor formed by the control portion 14 and the fifth region connecting semiconductor portion 135 is an N-type thin-film transistor, the fixed voltage terminal may be controlled to transmit a low-level signal, and the low-level signal can control the N-type thin-film transistor to be in an off state. In the embodiment of the present disclosure, it is taken as an example for illustration that the thin-film transistor formed by the control portion 14 and the fifth region connecting semiconductor portion 135 is a P-type thin-film transistor.

On the basis of the above described embodiment, and with continued reference to FIG. 20, the array substrate further includes a power signal line PVDD, and the power signal line PVDD extends along the column direction and is electrically connected to the pixel circuits. The power signal line PVDD includes a first branch part 15, and the first branch part 15 is also used as the control portion 14.

Exemplarily, it can be seen from the description of the structure and operation process of the pixel circuit with reference to FIG. 2 and FIG. 4 that the array substrate may further include the power signal line PVDD, and the power signal line PVDD is configured to provide a PVDD power signal for the light-emitting element to ensure that the light-emitting element can emit light normally. Generally, PVDD is a high-level signal. As shown in FIG. 20, the power signal line PVDD includes the first branch part 15, and the first branch part 15 is also used as the control portion 14, and the high-level PVDD power signal serves as the control signal of the switching element to control the switching element to remain off, thereby ensuring that the open circuit between the first node N1 and the second node N2 in the two pixel driving semiconductor portions located on the two sides of the functional region FU. In addition, the power signal line PVDD originally provided in the array substrate 100 serves as the control portion 14, which ensures that the control portion 14 can be provided in a simple way.

It is to be noted that, in FIG. 20, it is only taken as an example that the first branch part 15 is a part of the power signal line PVDD. It can be understood that according to the arrangement of the power signal line PVDD and the arrangement of the fifth region connecting semiconductor portion 135, the first branch part 15 may further include other arrangements, which is not limited in the embodiments of the present disclosure.

It is further to be noted that, only two power signal lines PVDD are shown in FIG. 20. It is to be understood that multiple power signal lines PVDD may be provided in the array substrate, for example, one power signal line PVDD may be provided for each column of the pixel driving semiconductor portions 11, and the specific arrangement of the power signal lines PVDD is not limited in the embodiment of the present disclosure. Further, the power signal line PVDD shown in FIG. 20 avoids the functional region FU and does not interfere with the arrangement of components in the functional region FU.

Figure 21:
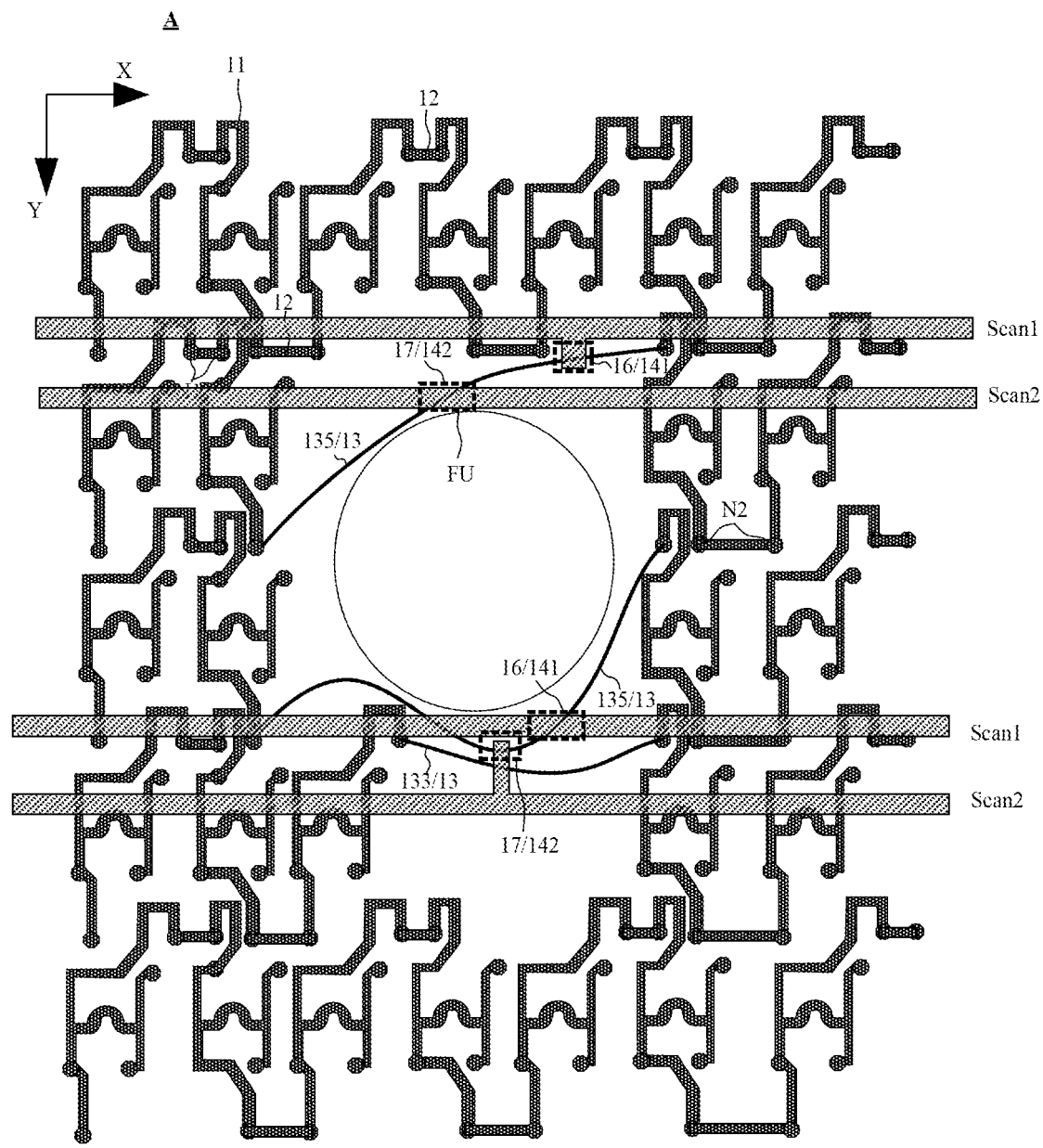
FIG. 21 is another enlarged exemplary view of the region A in FIG. 17.

Optionally, FIG. 21 is another enlarged exemplary view of the region A in FIG. 17. As shown in FIG. 21, the control portion 14 includes a first control portion 141 and a second control portion 142, the first control portion 141 and the second control portion 142 at least partially overlap with the same fifth region connecting semiconductor portion 135 in the direction perpendicular to the plane where the array substrate is located, and the first control portion 141 and the second control portion 142 do not overlap in the direction perpendicular to the plane where the array substrate is located. The first control portion 141 and the fifth region connecting semiconductor portion 135 as well as the second control portion 142 and the fifth region connecting semiconductor portion 135 respectively constitute a first sub-switching element and a second sub-switching element. The first control portion 141 and the second control portion 142 respectively receive different electrical signals, and at any time, at least one of the first sub-switching element and the second sub-switching element is in an off state.

Exemplarily, as shown in FIG. 21, the control portion 14 may further include a first control portion 141 and a second control portion 142. In the direction perpendicular to the substrate, each of the first control portion 141 and the second control portion 142 overlaps with the fifth region connecting semiconductor portion 135. Therefore, the first control portion 141 and one region of the fifth region connecting semiconductor portion 135 form a first sub-switch, and the second control portion 142 and another region of the fifth region connecting semiconductor portion 135 form a second sub-switch. At least one of the first sub-switching element and the second sub-switching element is in an off state, thereby ensuring that a signal transmitted in the fifth region connecting semiconductor portion 135 cannot be normally transmitted at the position of the first sub-switching element and/or the position of the second sub-switching element, and ensuring an open circuit between the first node N1 and the second node N2 in the two pixel driving semiconductor portions located on the two sides of the functional region FU.

On the basis of the above embodiment, with continued reference to FIG. 21, the array substrate further includes the first scan signal line Scan1 and the second scan signal line Scan2. The first scan signal line Scan1 extends in the row direction and is electrically connected to the pixel circuits, the first scan signal line includes a second branch part 16, and the second branch part 16 is also used as the first control portion 141. The second scan signal line Scan2 extends in the row direction and is electrically connected to the pixel circuits, the second scan signal line Scan2 includes a third branch part 17, and the third branch part 17 is also used as the second control portion 142.

Exemplarily, as can be seen from the description of the structure and operation process of the pixel circuits with reference to FIG. 2 and FIG. 4, the array substrate further includes the first scan signal line Scan1 and the second scan signal line Scan2, and the first scan signal line Scan1 and the second scan signal line Scan2 are configured to provide scan signals for the thin-film transistors in the pixel circuits to ensure normal operation of the pixel circuits. Generally, it can be known from the timing sequence diagram shown in FIG. 5 that at any time, at least one of the first scan signal line Scan1 and the second scan signal line Scan2 is a high-level signal. Therefore, in the case where the second branch part 16 in the first scan signal line Scan1 is also used as the first control portion 141 and the third branch part 17 in the second scan signal line Scan2 is also used as the second control portion 142, at least one signal of the signals of the second branch part 16 and the third branch part 17 is a high-level signal, so that at least one of the first sub-switching element and the second sub-switching element can be controlled to be in an off state. Thus, it can be ensured that the signal transmitted in the fifth region connecting semiconductor portion 135 cannot be normally transmitted at the position of the first sub-switching element and/or the position of the second sub-switching element and the open circuit between the first node N1 and the second node N2 in the two pixel driving semiconductor portions located on the two sides of the functional region FU can be ensued. In addition, the scan signal line originally provided in the array substrate 100 serves as the control portion 14, thereby ensuring that the control portion 14 can be provided in a simple manner.

It is to be noted that, in FIG. 21, the first scan signal line Scan1 and the second scan signal line Scan2 are shown only in a region corresponding to the fifth region connecting semiconductor portion 135. According to the foregoing description, each row of the pixel driving semiconductor portions 11 correspond to two scan signal lines, that is, the first scan signal line Scan1 and the second scan signal line Scan2. In FIG. 21, for the first scan signal line Scan1 and the second scan signal line Scan2 located above the functional region FU, it is taken as an example for illustration in FIG. 21 that the third branch part 17 is a part of the second scan signal line Scan 2; and for the first scan signal line Scan1 and the second scan signal line Scan2 located below the functional region FU, it is taken as an example for illustration in FIG. 21 that the second branch part 16 is a part of the first scan signal line Scan1. It is to be understood that, according to the arrangements of the first scan signal line Scan1 and the second scan signal line Scan2 and the arrangement of the fifth region connecting semiconductor portion 135, the second branch part 16 and the third branch part 17 may also include other arrangements, which is not limited in the embodiment of the present application.

On the basis of the above-described embodiment, with continued reference to FIG. 2, the pixel circuit according to the embodiments of the present disclosure may further include a first connection part 18 and a second connection part 19, the reference signal line Vref includes the first reference signal line Vref1 and the second reference signal line Vref2 that extend in the row direction and are parallel to each other, and two fixed potential nodes include a first node N1 and a second node N2. The first node N1 and the first reference signal line Vref1 are electrically connected by the first connection part 18; and the second node N2 and the second reference signal line Vref2 are electrically connected by the second connection part 19.

Exemplarily, with continued reference to FIG. 2, the first node N1 is electrically connected to the first reference signal line Vref1 through the first connection part 18 to achieve the transmission of the first reference signal, thereby ensuring that the gate of the drive transistor can be reset. The second node N2 is electrically connected to the second reference signal line Vref2 by the second connection part 19 to achieve the transmission of the second reference signal, thereby ensuring that the anode of the light-emitting element can be reset and ensuring the normal operation of the display panel.

On the basis of the above-described embodiments, with continued reference to FIG. 2, the array substrate includes a substrate and a drive circuit layer arranged on the substrate, and the drive circuit layer includes a semiconductor layer, a first metal layer, a capacitive metal layer, a second metal layer, and a third metal layer that are stacked in a direction away from the substrate.

The pixel driving semiconductor portion is located on the semiconductor layer, the reference signal line is located on the first metal layer or the capacitive metal layer, and the first connection part and the second connection part are located on the second metal layer or the third metal layer.

It can be known from the foregoing that the pixel circuit may include multiple thin-film transistors and a storage capacitor, each of the thin-film transistors includes an active layer, a gate, a source and a drain; and the storage capacitor includes a first capacitor plate and a second capacitor plate. The array substrate further includes a scan signal line, a data signal line, a reference signal line, and a power signal line. Where the active layer is the pixel driving semiconductor portion, that is, the active layer is d located in the semiconductor layer located in the drive circuit layer and is located on the side of the drive circuit layer close to the substrate. Further, the gate, the first capacitor plate, and the scan signal line may be located in the first metal layer in the drive circuit layer. The second capacitor plate may be located in the capacitive metal layer in the drive circuit layer. The source and the drain and the data signal line may be located in the second metal layer. The power signal line may be located in the second metal layer and/or the third metal layer. Further, the reference signal line may be located in the first metal layer or the capacitive metal layer, the first connection part and the second connection part may be located in the second metal layer or the third metal layer, and the first connection part and the second connection part are electrically connected to the reference signal line through via holes, respectively, for implementing the transmission of reference signals. In this way, the arrangement of the first connection part and the second connection part is achieved by using the film layer in the drive circuit layer, thereby ensuring the arrangement of the first connection part and the second connection part to be simple and the film layer structure of the display panel to be simple.

Figure 22:
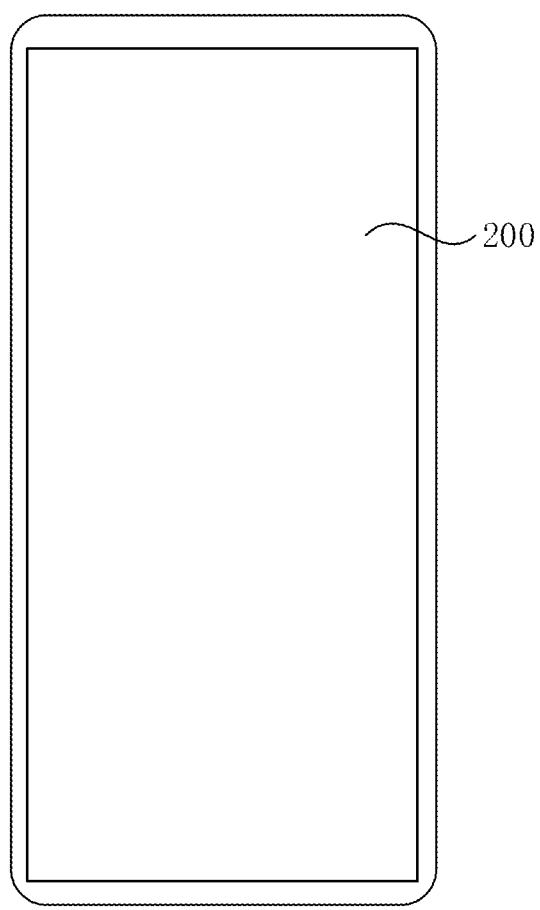
FIG. 22 is a structural diagram of a display device according to an embodiment of the present disclosure.

Based on the same concept described above, a display device is further provided according to an embodiment of the present disclosure. FIG. 22 is a structural diagram of a display device according to an embodiment of the present disclosure. As shown in FIG. 22, the display device includes the display panel 200 in the above-described embodiments. The display device includes a display panel according to any embodiment of the present disclosure, and therefore, the display device according to the embodiment of the present disclosure has corresponding advantageous effects of the display panel according to the embodiments of the present disclosure, and details are not described herein again. Exemplarily, the display device may be a mobile phone, a computer, a smart wearable device (for example, a smart watch), an onboard display device, and other electronic devices, which is not limited in the embodiments of the present disclosure.

It is to be noted that the above are merely preferred embodiments of the present disclosure and technical principles used therein. The person skilled in the art will appreciate that the present disclosure is not limited to the particular embodiments herein and that various significant changes, readjustments, combinations and substitutions can be made for the person skilled in the art without departing from the scope of protection of the present disclosure. Therefore, while the present disclosure has been described in detail through the above-mentioned embodiments, the present disclosure is not limited to the above-described embodiments and may include more other equivalent embodiments without departing from the concept of the present disclosure. The scope of the present disclosure is determined by the scope of the appended claims.

What is claimed is:

1. A display panel, comprising an array substrate, wherein the array substrate comprises:
    a plurality of pixel circuits, wherein the plurality of pixel circuits are arranged in an array in a row direction and a column direction, each of the plurality of pixel circuits comprises a pixel driving semiconductor portion, the pixel driving semiconductor portion comprises two fixed potential connecting nodes, and the row direction intersects the column direction;

a plurality of reference signal lines, wherein the two fixed potential connecting nodes are electrically connected to at least one of the plurality of reference signal lines; and a plurality of pixel connecting semiconductor portions, wherein two fixed potential connecting nodes adjacent in a first direction are electrically connected by one of the plurality of pixel connecting semiconductor portions, and the first direction is parallel to a plane where the array substrate is located;

wherein the plurality of reference signal lines comprise a first reference signal line and a second reference signal line that extend in the row direction; the two fixed potential connecting nodes comprise a first node and a second node; and in a same pixel driving semiconductor portion, the first node is electrically connected to the first reference signal line, and the second node is electrically connected to the second reference signal line;

wherein two pixel driving semiconductor portions adjacent in the row direction comprise a first pixel driving semiconductor portion and a second pixel driving semiconductor portion; and the first node in the first pixel driving semiconductor portion is electrically connected to the first node in the second pixel driving semiconductor portion by one of the plurality of pixel connecting semiconductor portions, or the second node in the first pixel driving semiconductor portion is electrically connected to the second node in the second pixel driving semiconductor portion by one of the plurality of pixel connecting semiconductor portions;

wherein a plurality of pixel driving semiconductor portions comprise an i-th pixel driving semiconductor portion, an (i+1)-th pixel driving semiconductor portion, and an (i+2)-th pixel driving semiconductor portion arranged sequentially in the row direction, wherein i is a positive integer;

wherein the plurality of pixel connecting semiconductor portions comprise a first pixel connecting semiconductor portion and a second pixel connecting semiconductor portion; and wherein the second node in the i-th pixel driving semiconductor portion and the second node in the (i+1)-th pixel driving semiconductor portion are electrically connected by the second pixel connecting semiconductor portion, and the first node in the (i+1)-th pixel driving semiconductor portion and the first node in the (i+2)-th pixel driving semiconductor portion are electrically connected by the first pixel connecting semiconductor portion.

2. The display panel according to claim 1, wherein
the first node and the second node in the pixel driving semiconductor portion are respectively located on two opposite sides of the pixel driving semiconductor portion in a second direction, the second direction is parallel to the plane where the array substrate is located, and the second direction is parallel to the column direction or an included angle between the second direction and the column direction is an acute angle; and
in the row direction, patterns of pixel driving semiconductor portions in two adjacent pixel circuits arranged sequentially are different and patterns of two pixel driving semiconductor portions spaced apart by one pixel driving semiconductor portion are the same.

3. The display panel according to claim 1, wherein
two adjacent pixel driving semiconductor portions arranged sequentially in the row direction comprise a first pixel driving semiconductor portion and a second pixel driving semiconductor portion, a pixel driving semiconductor portion located on a first side of the first pixel driving semiconductor portion in the column direction is a third pixel driving semiconductor portion, and a pixel driving semiconductor portion located on a first side of the second pixel driving semiconductor portion in the column direction is a fourth pixel driving semiconductor portion; and the first node in the first pixel driving semiconductor portion, the first node in the second pixel driving semiconductor portion, the second node in the third pixel driving semiconductor portion and the second node in the fourth pixel driving semiconductor portion are arranged in the row direction; and the first node in the first pixel driving semiconductor portion and the first node in the second pixel driving semiconductor portion are located between the second node in the third pixel driving semiconductor portion and the second node in the fourth pixel driving semiconductor portion in the row direction, or the second node in the third pixel driving semiconductor portion and the second node in the fourth pixel driving semiconductor portion are located between the first node in the first pixel driving semiconductor portion and the first node in the second pixel driving semiconductor portion in the row direction.

4. The display panel according to claim 3, wherein the pixel driving semiconductor portion comprises a U-shaped part, wherein the U-shaped part comprises a connection part, a first branch part and a second branch part; the first branch part and the second branch part are respectively connected to two ends of the connection part; the first branch part and the second branch part are arranged in the row direction and extend in the column direction; and an end of the first branch part away from the connection part is the first node.

5. The display panel according to claim 4, wherein in the row direction, the first branch part in the first pixel driving semiconductor portion is located on a side of the second branch part in the first pixel driving semiconductor portion away from the second node in the third pixel driving semiconductor portion and the first branch part in the second pixel driving semiconductor portion is located on a side of the second branch part in the second pixel driving semiconductor portion away from the second node in the fourth pixel driving semiconductor portion; or, in the row direction, the second node in the third pixel driving semiconductor portion is located on a side of the second branch part in the first pixel driving semiconductor portion away from the first node in the first pixel driving semiconductor portion and the second node in the fourth pixel driving semiconductor portion is located on a side of the second branch part in the second pixel driving semiconductor portion away from the first node in the second pixel driving semiconductor portion.

6. The display panel according to claim 1, wherein the plurality of pixel connecting semiconductor portions and the pixel driving semiconductor portion are disposed in a same layer.

7. The display panel according to claim 1, wherein
the first pixel connecting semiconductor portion and the second pixel connecting semiconductor portion extend in the row direction.

8. The display panel according to claim 1, wherein in a direction perpendicular to the plan where the display panel is located, neither of the first pixel connecting semiconductor portion and the second pixel connecting semiconductor portion overlaps with the first reference signal line and the second reference signal line.

9. The display panel according to claim 1, wherein the first direction is the row direction.

10. The display panel according to claim 1, wherein
pixel driving semiconductor portions arranged in the column direction comprise pixel driving semiconductor portions in a j-th row and pixel driving semiconductor portions in a (j+1)-th row, wherein j is a positive integer; and
at least two second nodes in the pixel driving semiconductor portions in the j-th row and at least two first nodes in the pixel driving semiconductor portions in the (j+1)-th row are arranged in the row direction.

11. The display panel according to claim 1, wherein
pixel driving semiconductor portions arranged in the column direction comprise pixel driving semiconductor portions in a j-th row and pixel driving semiconductor portions in a (j+1)-th row, wherein j is a positive integer; and
in a direction extending in the row direction, the second pixel connecting semiconductor portion connected to the pixel driving semiconductor portions in the j-th row overlaps with the first pixel connecting semiconductor portion connected to the pixel connecting semiconductor portions in the (j+1)-th row.

12. The display panel according to claim 1, wherein
pixel driving semiconductor portions arranged in the column direction comprise pixel driving semiconductor portions in a j-th row and pixel driving semiconductor portions in a (j+1)-th row, wherein j is a positive integer; and
a spacing is provided between the second pixel connecting semiconductor portion connected to the pixel driving semiconductor portions in the j-th row and the first pixel connecting semiconductor portion connected to the pixel connecting semiconductor portions in the (j+1)-th row.

13. The display panel according to claim 1, wherein each of the plurality of pixel circuits further comprises a first connection portion and a second connection portion, the first node and the first reference signal line are electrically connected by the first connection portion, and the second node and the second reference signal line are electrically connected by the second connection portion.

14. The display panel according to claim 13, wherein
the array substrate further comprises a substrate and a drive circuit layer disposed on the substrate, and the drive circuit layer comprises a semiconductor layer, a first metal layer, a capacitive metal layer, a second metal layer and a third metal layer stacked in a direction away from the substrate; and
the first connection portion and the second connection portion are located in the second metal layer, or the first connection portion and the second connection portion are located in the third metal layer.

15. The display panel according to claim 14, wherein the plurality of reference signal lines is located in the first metal layer or the capacitive metal layer.

16. The display panel according to claim 1, wherein each of the plurality of pixel circuits further comprises a drive transistor, a light-emitting element, a first reset transistor and a second reset transistor, the drive transistor is configured to control the light-emitting element to light up, the first reset transistor is electronically connected to a gate of the drive transistor, and the second reset transistor is electronically connected to an anode of the light-emitting element; and
one terminal of the first reset transistor is electrically connected to the first node, and another terminal of the first reset transistor is electrically connected to the gate of the drive transistor; and
one terminal of the second reset transistor is electrically connected to the second node, and another terminal of the second reset transistor is electrically connected to the anode of the light-emitting element.

17. The display panel according to claim 1, wherein the first reset transistor and the second reset transistor are each a dual-gate transistor.

18. The display panel according to claim 1, wherein the first reference signal line and the second reference signal line provide different reference signals.

19. A display panel, comprising an array substrate, wherein the array substrate comprises:
a plurality of pixel circuits, wherein the plurality of pixel circuits are arranged in an array in a row direction and a column direction, each of the plurality of pixel circuits comprises a pixel driving semiconductor portion, the pixel driving semiconductor portion comprises two fixed potential connecting nodes, and the row direction intersects the column direction;
a plurality of reference signal lines, wherein the two fixed potential connecting nodes are electrically connected to at least one of the plurality of reference signal lines; and
a plurality of pixel connecting semiconductor portions, wherein two fixed potential connecting nodes adjacent in a first direction are electrically connected by one of the plurality of pixel connecting semiconductor portions, and the first direction is parallel to a plane where the array substrate is located;
wherein the plurality of reference signal lines comprise a first reference signal line and a second reference signal line that extend in the row direction; the two fixed potential connecting nodes comprise a first node and a second node; and in a same pixel driving semiconductor portion, the first node is electrically connected to the first reference signal line, and the second node is electrically connected to the second reference signal line;
wherein two pixel driving semiconductor portions adjacent in the row direction comprise a first pixel driving semiconductor portion and a second pixel driving semiconductor portion; and the first node in the first pixel driving semiconductor portion is electrically connected to the first node in the second pixel driving semiconductor portion by one of the plurality of pixel connecting semiconductor portions, or the second node in the first pixel driving semiconductor portion is electrically connected to the second node in the second pixel driving semiconductor portion by one of the plurality of pixel connecting semiconductor portions; and
wherein the pixel driving semiconductor portion comprises a U-shaped part, wherein the U-shaped part comprises a connection part, a first branch part and a second branch part; the first branch part and the second branch part are respectively connected to two ends of the connection part; the first branch part and the second branch part are arranged in the row direction and extend in the column direction; and an end of the first branch part away from the connection part is the first node.

20. A display panel, comprising an array substrate, wherein the array substrate comprises:
a plurality of pixel circuits, wherein the plurality of pixel circuits are arranged in an array in a row direction and a column direction, each of the plurality of pixel circuits comprises a pixel driving semiconductor portion, the pixel driving semiconductor portion comprises two fixed potential connecting nodes, and the row direction intersects the column direction;

a plurality of reference signal lines, wherein the two fixed potential connecting nodes are electrically connected to at least one of the plurality of reference signal lines; and a plurality of pixel connecting semiconductor portions, wherein two fixed potential connecting nodes adjacent in a first direction are electrically connected by one of the plurality of pixel connecting semiconductor portions, and the first direction is parallel to a plane where the array substrate is located;

wherein the plurality of reference signal lines comprise a first reference signal line and a second reference signal line that extend in the row direction; the two fixed potential connecting nodes comprise a first node and a second node; and in a same pixel driving semiconductor portion, the first node is electrically connected to the first reference signal line, and the second node is electrically connected to the second reference signal line;

wherein two pixel driving semiconductor portions adjacent in the row direction comprise a first pixel driving semiconductor portion and a second pixel driving semiconductor portion; and the first node in the first pixel driving semiconductor portion is electrically connected to the first node in the second pixel driving semiconductor portion by one of the plurality of pixel connecting semiconductor portions, or the second node in the first pixel driving semiconductor portion is electrically connected to the second node in the second pixel driving semiconductor portion by one of the plurality of pixel connecting semiconductor portions; and wherein the first reference signal line and the second reference signal line provide different reference signals.

* * * * *